United States Patent
Bradley

(10) Patent No.: US 6,356,810 B1
(45) Date of Patent: Mar. 12, 2002

(54) PROGRAMMABLE FREQUENCY REFERENCE FOR A SIGNAL SYNTHESIZER

(75) Inventor: Donald A. Bradley, Morgan Hill, CA (US)

(73) Assignee: Anritsu Company, Morgan Hill, CA (US)

( * ) Notice: Subject to any disclaimer, the term of this patent is extended or adjusted under 35 U.S.C. 154(b) by 0 days.

(21) Appl. No.: 09/182,385

(22) Filed: Oct. 29, 1998

(51) Int. Cl.[7] .......................... G05D 19/02; H03B 19/00
(52) U.S. Cl. ....................... 700/298; 331/18; 331/177 R
(58) Field of Search .................................. 700/298, 297; 331/16, 17, 18, 175, 177 R; 327/102, 105, 101; 455/323

(56) References Cited

U.S. PATENT DOCUMENTS

| | | | | |
|---|---|---|---|---|
| 4,272,729 A | * | 6/1981 | Riley, Jr. ..................... | 331/1 A |
| 4,940,950 A | * | 7/1990 | Helfrick ........................ | 331/2 |
| 5,021,754 A | * | 6/1991 | Shepherd et al. ........... | 332/128 |
| 5,339,049 A | * | 8/1994 | Bradley ........................ | 331/16 |
| 5,374,902 A | * | 12/1994 | Bradley .......................... | 331/2 |
| 5,781,044 A | * | 7/1998 | Riley et al. .................. | 327/105 |
| 6,087,865 A | * | 7/2000 | Bradley ....................... | 327/117 |

OTHER PUBLICATIONS

U.S. application No. 08/719,763, pending, filed on Sep. 25, 1996, by Donald A. Bradley, entitled "Frequency Synthesizer Using A Ratio Sum Topology".

U.S. application No. 08/847,672, pending, filed on April 24, 1997, by Donald A. Bradley, entitled "Programmable Frequency Divider".

* cited by examiner

Primary Examiner—Paul P. Gordon
(74) Attorney, Agent, or Firm—Fliesler Dubb; Meyer & Lovejoy

(57) ABSTRACT

A frequency reference is employed to correct a frequency error in a signal synthesizer. The frequency reference provides a reference frequency with a parts per million deviation from the reference's nominal frequency. The reference frequency parts per million deviation is equal in magnitude to the parts per million deviation of the frequency error from a desired signal synthesizer output frequency. The deviation in the reference frequency offsets the deviation from the desired output frequency to significantly reduce the frequency error. The frequency reference includes a voltage controlled oscillator, programmable voltage generator, and voltage control engine. The reference frequency is set by the voltage controlled oscillator in response to a frequency setting voltage from the programmable voltage generator. The voltage control engine is coupled to the programmable voltage generator to provide a voltage setting value that controls the frequency setting voltage.

40 Claims, 16 Drawing Sheets

PROGRAMMABLE FREQUENCY REFERENCE FOR A SIGNAL SYNTHESIZER

CROSS-REFERENCE TO RELATED APPLICATIONS

This application relates to the following U.S. Patents:

U.S. patent application Ser. No. 08/719,763 entitled "Frequency Synthesizer Using A Ratio Sum Topology", by Donald A. Bradley, filed Sep. 25, 1996; and U.S. Pat. No. 6,087,865 entitled "Programmable Frequency Divider", by Donald A. Bradley, issued Jul. 11, 2000.

The present application hereby incorporates these applications by reference.

BACKGROUND OF THE INVENTION

A. Field of Invention

The present invention is directed toward the field of signal synthesizers. More particularly, the present invention relates to a frequency reference for use in a signal synthesizer.

B. Description of the Related Art

A signal synthesizer is used to generate a signal or series of signals that have a specified set of characteristics. In one example, a frequency is specified for an output signal that is produced by the synthesizer. In another example, a range of frequencies is specified for a series of signals that are to be swept by the synthesizer. In order to provide a desired output frequency, the signal synthesizer employs a reference signal having a reference frequency. The reference frequency serves as a basis for deriving the desired output frequency.

Signals produced by the signal synthesizer are employed in a variety of applications, such as testing for faults in cables and other communication media. In many testing applications, it is desirable for the signal synthesizer to provide very accurate output frequencies at a high frequency resolution. When sweeping through a series of output signals, it is also important that the synthesizer has a small settling time, so that the output signals can be provided rapidly for use by the synthesizer's operator.

It is very challenging to provide output signals with high resolution, accurate frequencies, and small setting times. In fact, the reference frequency itself introduces frequency errors, by randomly deviating from an ideal reference frequency that the synthesizer expects to receive. Frequency modification circuitry within the signal synthesizer, such as a frequency synthesizer, can also cause additional frequency errors.

In order to improve the resolution and accuracy of a signal synthesizer, a frequency synthesizer within the signal synthesizer can employ multiple frequency synthesis loops with large frequency divisor values. However, the use of multiple loops can significantly increase the number of components used in the signal synthesizer. Such extra components can result in the cost and power requirements of the signal synthesizer being increased, which is especially undesirable in portable signal synthesizers. Additionally, the use of large frequency divisor values can cause settling times to increase significantly.

Accordingly, it is desirable to provide for a signal synthesizer that is able to accurately generate signals without compromising output frequency resolution or settling time or significantly increasing the number of components in the signal synthesizer.

SUMMARY OF THE INVENTION

In accordance with the present invention, a programmable frequency reference is provided in a signal synthesizer to enhance the synthesizer's output signal frequency accuracy and resolution, without compromising settling time. A signal synthesizer having such a programmable frequency reference also includes frequency modification circuitry. The frequency modification circuitry is coupled to the frequency reference to receive a reference frequency and modify it to produce a signal synthesizer output frequency. The programmable frequency reference provides the reference frequency, so that the reference frequency offsets frequency error that is introduced by the frequency modification circuitry. As a result, the accuracy and resolution of the signal synthesizer's output frequency is improved, without adding circuitry to the frequency modification circuitry, or compromising the signal synthesizer's settling time.

The frequency reference includes a voltage controlled oscillator, programmable voltage generator, and voltage control engine. The voltage controlled oscillator provides a signal having the reference frequency in response to a frequency setting voltage. The programmable voltage generator has an output coupled to the voltage controlled oscillator for providing the frequency setting voltage in response to a voltage setting value. The voltage control engine has an output coupled to the programmable voltage generator for providing the voltage setting value.

The voltage control engine sets the voltage setting value in response to the frequency error that is introduced by the frequency modification circuitry. The voltage setting value is set to provide for the generation of a frequency setting voltage that causes the voltage controlled oscillator's reference frequency to have a certain deviation from the nominal frequency of the voltage controlled oscillator. The certain deviation is one that provides for offsetting the frequency error caused by the frequency modification circuitry. As a result, an accurate signal synthesizer output frequency is generated.

In one embodiment of the present invention, the frequency modification circuitry includes a frequency synthesizer and a frequency divider coupled to receive the output of the frequency synthesizer. The frequency synthesizer is coupled to receive the reference frequency and convert it into a synthesizer frequency that is divided by the frequency divider to produce the signal synthesizer output frequency. In such an embodiment, the frequency synthesizer provides the frequency error that is corrected by the programmable frequency reference.

BRIEF DESCRIPTION OF THE DRAWINGS

Further details of the present invention are explained with the help of the attached drawings in which.

DETAILED DESCRIPTION

A. Signal Synthesizer

Figure 1:
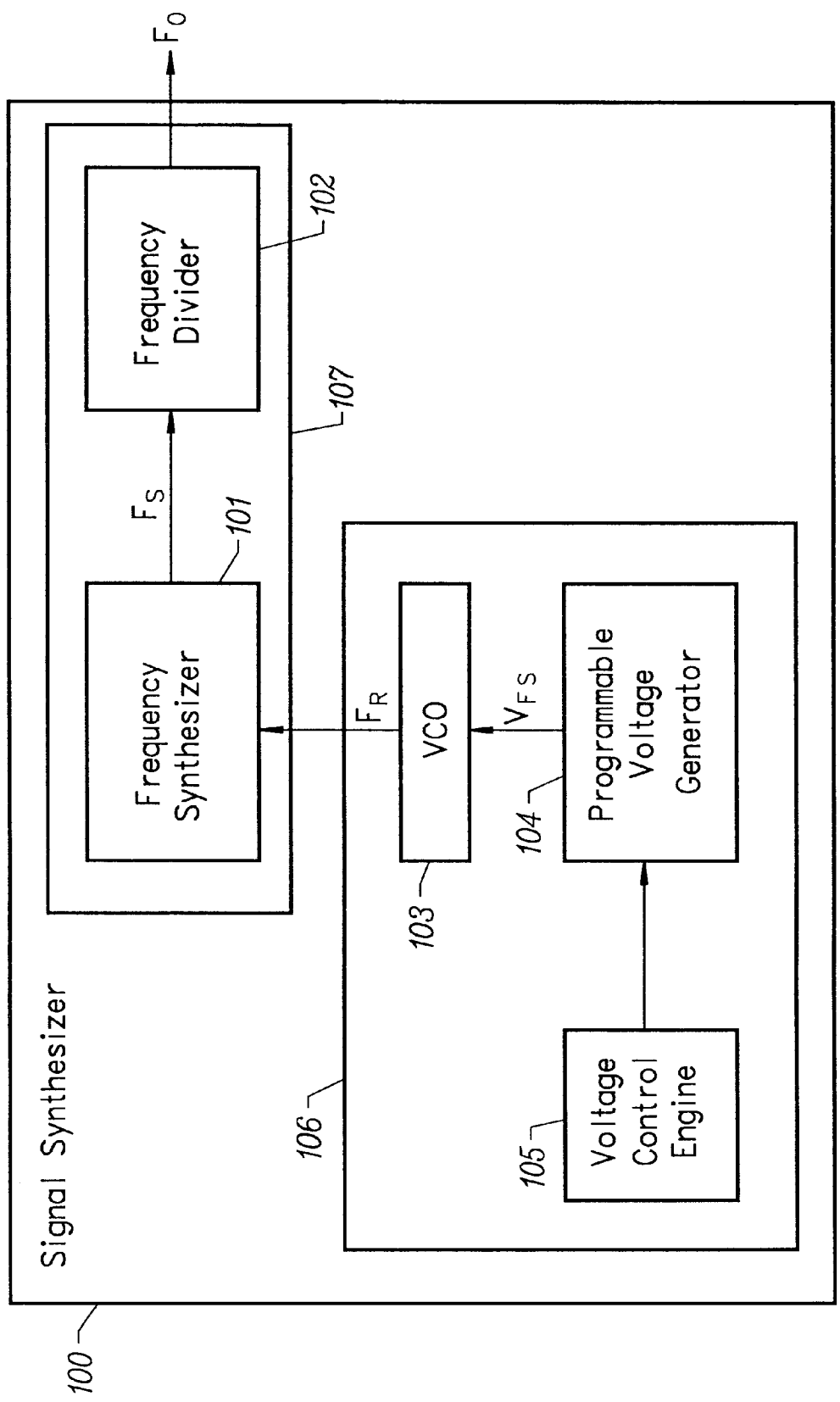
FIG. 1 illustrates a signal synthesizer in accordance with the present invention.

FIG. 1 illustrates a signal synthesizer 100 in accordance with the present invention. The signal synthesizer 100 includes a frequency reference 106 coupled to frequency modification circuitry 107, which includes a frequency synthesizer 101 and frequency divider 102 in one embodiment of the present invention. The signal synthesizer 100 provides an output signal having a predetermined output frequency ($F_O$). In one embodiment of the present invention, a user of the signal synthesizer 100 specifies output frequency $F_O$ through a user interface (not shown) that is also included in the signal synthesizer 100.

The frequency reference 106 generates a reference signal having a reference frequency ($F_R$), which the frequency modification circuitry 107 converts into output frequency $F_O$. In the frequency modification circuitry 107 shown in FIG. 1, the frequency synthesizer 101 is coupled to the frequency reference 106 to receive the reference signal having reference frequency $F_R$. The frequency synthesizer 101 synthesizes the reference frequency to generate a synthesizer output signal having a synthesizer frequency ($F_S$). The frequency divider 102 is coupled to the frequency synthesizer 101 to receive the synthesizer output signal having synthesizer frequency $F_S$. The frequency divider 102 converts the synthesizer frequency ($F_S$) to generate the signal synthesizer 100 output signal having output frequency $F_O$.

In the signal synthesizer 100 shown in FIG. 1, frequency error is introduced by the frequency synthesizer 101. The frequency error is commonly measured in parts per million. For example, a 2 hertz (Hz) error in a 1 megahertz (MHz) frequency is an error of 2 parts per million. The frequency divider 102 passes the error from the frequency synthesizer 101 onto the signal synthesizer output, without adding additional error.

In accordance with the present invention, the frequency reference 106 provides the frequency synthesizer 101 with a reference frequency ($F_R$) that offsets the error being introduced by the frequency synthesizer 101. As a result, the error in the signal synthesizer's output frequency ($F_O$) is significantly reduced or eliminated, without adding additional circuitry or large frequency dividers to the frequency synthesizer. This enables frequency error correction to be achieved without increasing either settling time or the number of frequency synthesizer components. By providing a frequency reference 106 that can be adjusted in small increments, it is also possible to provide for very good output frequency $F_O$ resolution. As will be shown below, it is possible for a signal synthesizer in accordance with the present invention to have a settling time of less than 50 microseconds and a resolution of less than 1 Hz.

In order to provide a reference frequency in accordance with the present invention, the frequency reference 106 includes a voltage controlled oscillator ("VCO") 103, programmable voltage generator 104, and voltage control engine 105. The VCO 103 provides the reference frequency ($F_R$) in response to a frequency setting voltage ($V_{FS}$). The programmable voltage generator 104 is coupled to the VCO 103 to provide the frequency setting voltage ($V_{FS}$) in response to a voltage setting value. The voltage control engine 105 is coupled to the programmable voltage generator 104 to provide the voltage setting value.

In one embodiment of the present invention, the voltage control engine 105 includes a processing engine, such as a microcontroller, coupled to a memory, such as a read only memory or random access memory. When the voltage control engine 105 is in operation, in such an embodiment, the processing engine executes instructions from the memory that cause the voltage control engine to perform the steps described in this application, such as providing a voltage setting value.

In order to provide for generating frequency setting voltages ($V_{FS}$) that accurately control the reference frequency ($F_R$), the VCO 103 is characterized. As a result of the characterization, the frequency setting voltage ($V_{FS}$) is expressed as a function of the resulting parts per million deviation of the reference frequency ($F_R$) from a nominal frequency of the VCO 103. In one embodiment of the present invention, the VCO 103 is a 12.8 MHz voltage controlled temperature compensated crystal oscillator manufactured by Oscillatek and sold under the part number T-1050-1A1.

The voltage control engine 105 and programmable voltage generator 104 work in combination to generate a frequency setting voltage ($V_{FS}$) by employing this characterization of the VCO 103. The frequency setting voltage ($V_{FS}$) that is generated causes the VCO 103 to supply a reference frequency ($F_R$) with sufficient parts per million deviation to offset the parts per million frequency error induced by the frequency modification circuitry 107.

Figure 2:
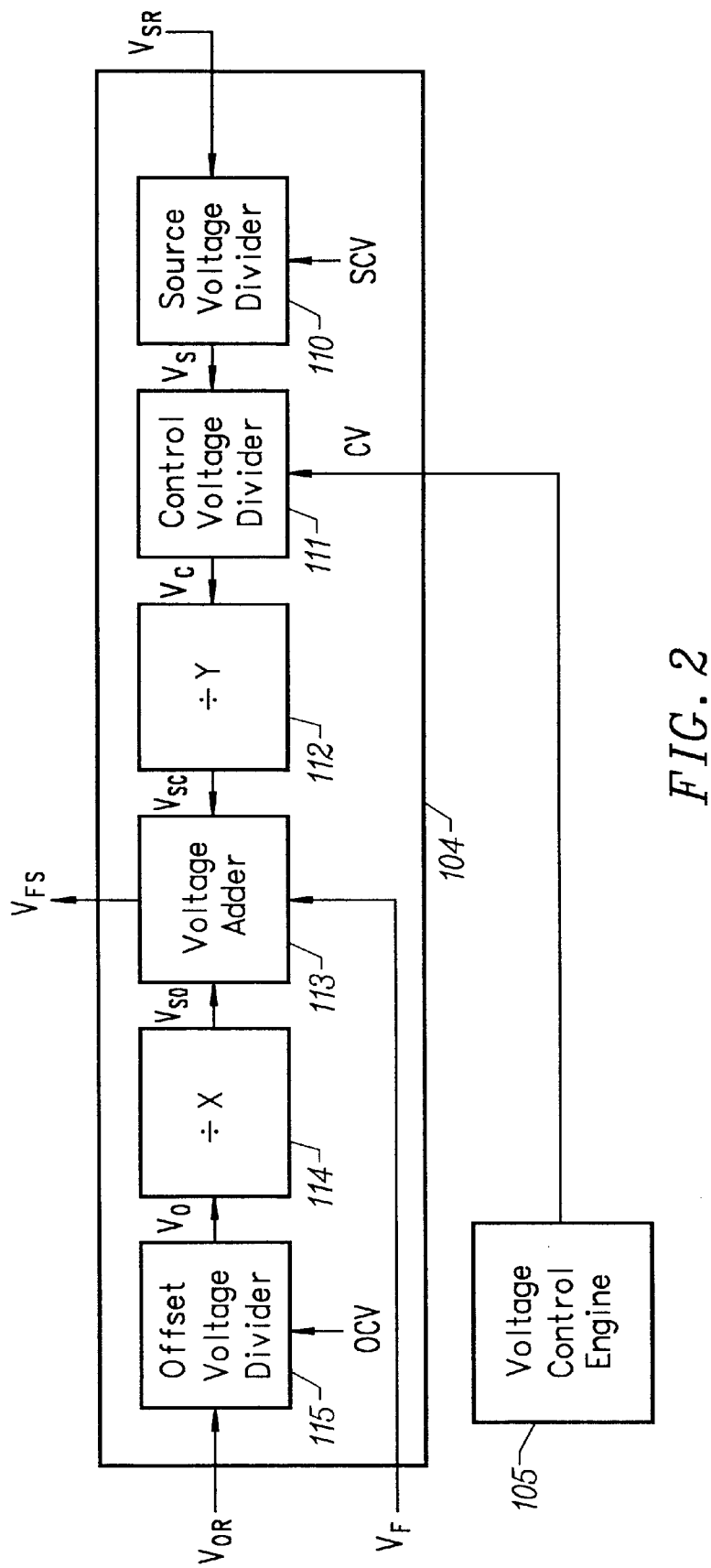
FIG. 2 illustrates a programmable voltage generator for use in the frequency reference shown in FIG. 1 in one embodiment of the present invention.

FIG. 2 illustrates a programmable voltage generator 104 in one embodiment of the present invention. The programmable voltage generator 104 includes a voltage adder 113, which receives and sums voltages to provide the frequency setting voltage ($V_{FS}$) at the output of the programmable voltage generator 104. As shown in FIG. 2, the voltage adder 113 is coupled to receive and sum a fixed voltage ($V_F$), scaled offset voltage ($V_{SO}$), and scaled control voltage ($V_{SC}$). In one embodiment of the present invention, the fixed voltage ($V_F$) is provided by a DC voltage source. In an alternate embodiment of the present invention, no fixed voltage is provided to the voltage adder 113.

The scaled offset voltage is derived from the output ($V_O$) of an offset voltage divider 115, which is coupled to the voltage adder 113 via an offset scaling voltage divider 114. The offset voltage divider 115 has a voltage input coupled to receive an offset reference voltage ($V_{OR}$) and a control input coupled to receive an offset control value (OCV). The output of the offset voltage divider 115 supplies an offset voltage ($V_O$) by processing the offset reference voltage in response to the offset control value (OCV). In one embodiment of the present invention, the offset voltage ($V_O$) is set to be equal to the offset reference voltage ($V_{OR}$) multiplied by the offset control value (OCV) divided by a maximum possible value for the offset control value.

The output ($V_O$) of the offset voltage divider 115 is coupled to an input of the offset scaling voltage divider 114, which divides the offset voltage ($V_O$) by an offset scaling divisor (X) to obtain the scaled offset voltage ($V_{SO}$). An output of the offset scaling voltage divider 114 is coupled to the voltage adder 113 to provide the scaled offset voltage ($V_{SO}$). The offset scaling voltage divider 114 allows for a greater range of voltages to be provided by the offset voltage divider 115. This provides for greater control over the resolution of the frequency setting voltage ($V_{FS}$).

The scaled control voltage ($V_{SC}$) is derived from the output ($V_C$) of a control voltage divider 111, which is coupled to the voltage adder 113 via a control scaling voltage divider 112. The control voltage divider 111 has a voltage input coupled to receive a source voltage ($V_S$) and a control input coupled to receive the control value (CV). In one embodiment of the present invention, the control value is the voltage setting value.

The control voltage divider ill control input is coupled to the output of the voltage control engine 105. The voltage control engine 105 provides the control value (CV) to the programmable voltage divider's control input. The output of the control voltage divider 111 supplies a control voltage ($V_C$) by processing the source voltage ($V_S$) in response to the control value. In one embodiment of the present invention, the control voltage ($V_C$) is set to be equal to the source voltage ($V_S$) multiplied by the control value (CV) divided by a maximum possible value for the control value.

The output of the control voltage divider ($V_C$) is coupled to an input of the control scaling voltage divider 112, which divides the control voltage ($V_C$) by a control scaling divisor (Y) to obtain the scaled control voltage ($V_{SC}$). An output of the control scaling voltage divider 112 is coupled to the voltage adder 113 to provide the scaled control voltage ($V_{SC}$). The control scaling voltage divider 112 allows for a greater range of voltages to be provided by the control voltage divider 111. This provides for greater control over the resolution of the frequency setting voltage ($V_{FS}$).

The source voltage ($V_S$) is provided to the voltage input of the control voltage divider 111 by a source voltage divider 110. The source voltage divider 110 has an output coupled to the voltage input of the control voltage divider 111. The source voltage divider 110 includes a voltage input for receiving a source reference voltage ($V_{SR}$) and a control input for receiving a source control value (SCV). The source voltage divider 110 provides the source voltage ($V_S$) on its output by processing the source reference voltage ($V_{SR}$) in response to the source control value (SCV). In one embodiment of the present invention, the source voltage ($V_S$) is set to be equal to the source reference voltage ($V_{SR}$) multiplied by the source control value (SCV) divided by a maximum possible value for the source control value.

The frequency setting voltage ($V_{FS}$) is the sum of the scaled offset voltage ($V_{SO}$), scaled control voltage ($V_{SC}$), and fixed voltage ($V_F$) that are provided to the voltage adder 113. By controlling the scaled offset voltage, fixed voltage, and scaled control voltage, the frequency setting voltage ($V_{FS}$) can be set to cause the VCO 103 to provide a reference frequency ($F_R$) with a desired parts per million deviation from the nominal VCO frequency ($F_N$). In one embodiment of the present invention, the offset reference voltage ($V_{OR}$), offset control value (OCV), offset scaling divisor (X), source reference voltage ($V_{SR}$), source control value (SCV), and control scaling divisor (Y) are all set to predetermined values that are not altered during the operation of the programmable voltage generator 104. In such an embodiment, the frequency setting voltage ($V_{FS}$) is adjusted during the operation of the programmable voltage generator by adjusting the control value (CV). In such an embodiment, the control value (CV) is the voltage setting value.

In an alternate embodiment of the present invention, a different combination of the offset reference voltage ($V_{OR}$), offset control value (OCV), offset scaling divisor (X), source reference voltage ($V_{SR}$), source control value (SCV), control scaling divisor (Y), and control value (CV) are dynamically configured during the operation of the programmable voltage generator 104 to set the frequency setting voltage ($V_{FS}$). In such an embodiment, a combination of the dynamically configured variables serves as the voltage setting value.

Figure 3:
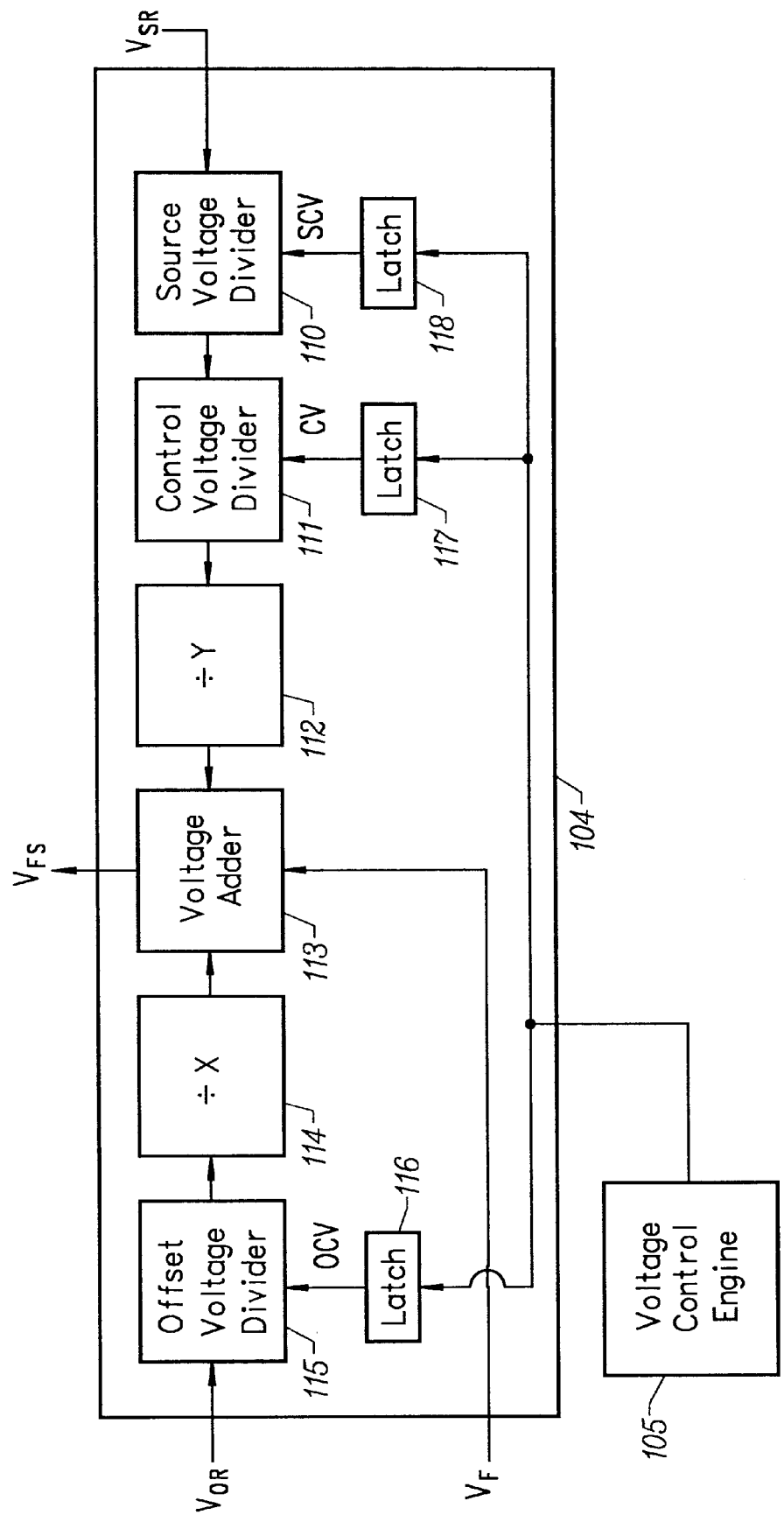
FIG. 3 illustrates a programmable voltage generator for use in the frequency reference shown in FIG. 1 in an alternate embodiment of the present invention.

FIG. 3 illustrates the programmable voltage generator 104 in an alternate embodiment of the present invention. The programmable voltage generator 104 shown in FIG. 3 is the same as the programmable voltage generator 104 shown in FIG. 2, with the following exceptions:

1. The output of the voltage control engine 105 is coupled to the control input of the offset voltage divider 115 through an offset data latch 116;
2. The output of the voltage control engine 105 is coupled to the control input of the control voltage divider 111 through a control data latch 117; and
3. The output of the voltage control engine 105 is coupled to the control input of the source voltage divider 110 through a source data latch 118.

In the embodiment shown in FIG. 3, the voltage control engine 105 sets the control value (CV) by determining the control value and writing the control value to the control data latch 117. The control data latch 117 has an input coupled to the output of the voltage control engine 105 and an output coupled to the control input of the control voltage divider 111 for providing the control value (CV).

The voltage control engine 105 provides the source control value (SCV) to the control input of the source voltage divider 110 by determining the source control value and providing the source control value to the source data latch 118. The source data latch 118 has an input coupled to the output of the voltage control engine 105 and an output coupled to the control input of the source voltage divider 110 for providing the source control value (SCV).

The voltage control engine 105 provides the offset control value (OCV) to the control input of the offset voltage divider 115 by determining the offset control value and providing the offset control value to the offset data latch at 116. The offset data latch 116 has an input coupled to the output of the voltage control engine 105 and an output coupled to the control input of the offset voltage divider 115 for providing the offset control value (OCV).

The output of the voltage control engine 105 includes address, data and control signals for individually addressing and providing data to the control data latch 117, offset data latch 116, and source data latch 118. Processes for determining the offset control value, control value, and source control value will be described below.

Figures 4, 5:
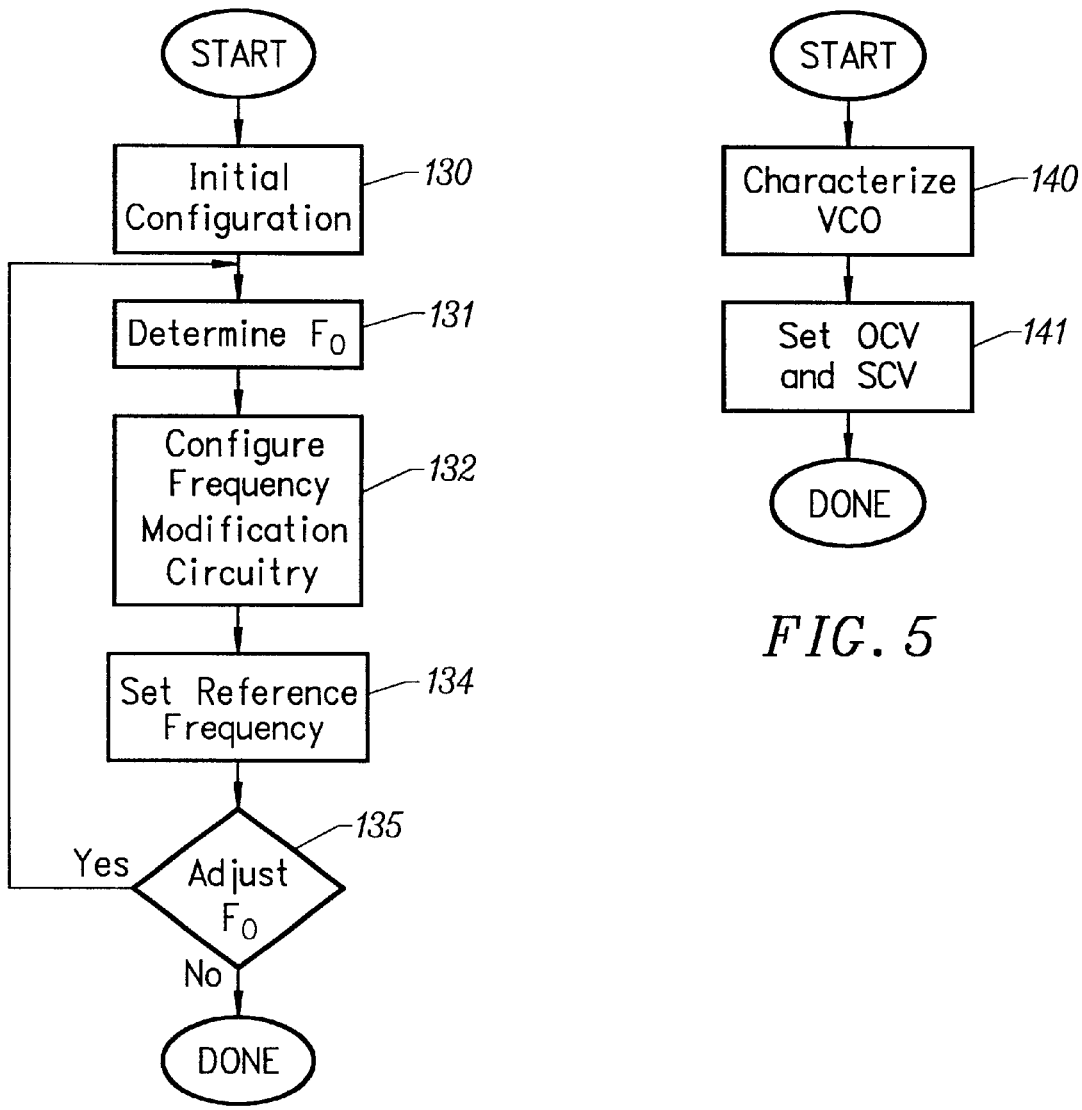
FIG. 4 illustrates a sequence of operations for configuring a signal synthesizer in accordance with the present invention.
FIG. 5 illustrates a sequence of operations for performing an initial configuration of the frequency reference shown in FIGS. 2 and 3.

B. Configuring the Signal Synthesizer,

FIG. 4 illustrates a sequence of operations that are performed to configure the signal synthesizer 100 for providing a desired output frequency ($F_O$), in accordance with the present invention. In one embodiment of the present invention, the operations set forth in FIG. 4 are performed by the voltage control engine 105 in response to instructions that are stored in a processor readable medium, such as a memory or portable recording medium. In alternate embodiments of the present invention, portions of the sequence of operations set forth in FIG. 4 are performed by means other than the voltage control engine 105. For example, in the embodiment shown in FIG. 2, the voltage control engine 105 is employed for setting the control value (CV), and other means are employed for setting the source control value (SCV) and offset control value (OCV).

As shown in FIG. 4, an initial configuration of the frequency reference 106 is performed in step 130. In the initial configuration 130, values are set for signal synthesizer 100 parameters that are not going to be adjusted during the operation of the signal synthesizer 100. For example, the offset control value (OCV) and source control value (SCV) are set during the initial configuration 130 in one embodiment of the present invention. The initial configuration 130 can be performed during the manufacture of the signal synthesizer 100, prior to the signal synthesizer 100 being made available to a user for operation.

After the initial configuration 130 is complete, the desired output frequency ($F_O$) for the signal synthesizer 100 is determined in step 131. In one embodiment of the present invention, this is achieved by querying the user of the signal synthesizer 100 for such information. Such a query can be carried out by a user interface (not shown) that is included in the signal synthesizer 100. Once the desired output frequency ($F_O$) is determined 131, the frequency modification circuitry in the signal synthesizer 100 is configured in step 132.

After the configuration 132 of the frequency modification circuitry, the reference frequency ($F_R$) is set in step 134. The reference frequency ($F_R$) is set so that it has a parts per million deviation from the frequency reference's nominal frequency ($F_N$) that offsets the frequency error introduced by the frequency modification circuitry 107 (FIG. 2). Once the reference frequency ($F_R$) is set, a determination is made in step 135 of whether it is desirable to further adjust the signal synthesizer's output frequency ($F_O$) in step 135. If the output frequency ($F_O$) is to be adjusted, then a new output frequency is determined in step 131, as described above. If no adjustment to the output frequency ($F_O$) is desired, then the process for configuring the signal synthesizer 100 is done.

FIG. 5 illustrates a sequence of operations for performing the initial configuration in step 130 (FIG. 4), in one embodiment of the present invention. In such an embodiment, the VCO 103 is characterized in step 140, so that the frequency setting voltage ($V_{FS}$) is expressed as a function of the reference frequency ($F_R$) parts per million deviation from the nominal frequency ($F_N$) of the VCO 103. This will enable the proper frequency setting voltage ($V_{FS}$) to be determined based on the parts per million frequency error introduced by the frequency modification circuitry 107.

After the VCO 103 is characterized 140, the offset control value (OCV) and source control value (SCV) are set in step 141. After setting both the offset control value (OCV) and the source control value (SCV) the initial configuration 130 is done.

Figure 6:
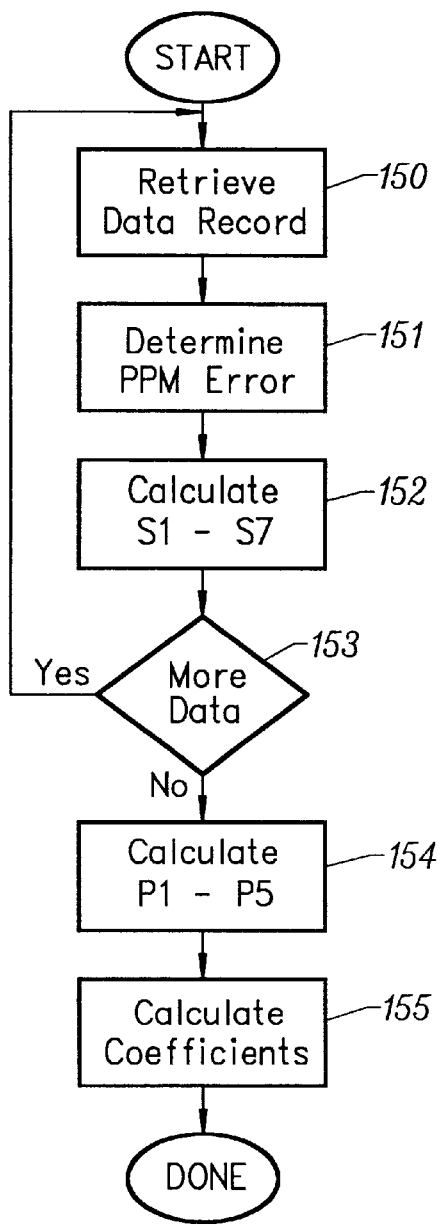
FIG. 6 illustrates a sequence of operations for characterizing a voltage control oscillator in a frequency reference in accordance with the present invention.

FIG. 6 illustrates a sequence of operations for characterizing 140 (FIG. 5) the VCO 103 in one embodiment of the present invention. In the sequence of operations depicted in FIG. 6, a least squares method is used to determine a quadratic equation that expresses the frequency setting voltage ($V_{FS}$) as a function of the parts per million frequency deviation of the reference frequency ($F_R$) from the nominal frequency ($F_N$) of the VCO 103.

Table A below shows a set of frequency setting voltage ($V_{FS}$) response measurements that have been made using a VCO 103 which is employed in one embodiment of the present invention. The VCO characterized in Table A is the Oscillatek T-1050-1A1 voltage controlled temperature compensated crystal oscillator with a nominal frequency ($F_N$) of 12.8 MHz. The data in Table A is employed in the performance of the sequence of operations shown in FIG. 6 for characterizing the VCO 103.

Table A includes data records each listing a frequency setting voltage ($V_{FS}$) being applied to the VCO 103 and a resulting reference frequency ($F_R$). For example, the first data record of Table A indicates that a frequency setting voltage of 0.8 volts results in a corresponding reference frequency ($F_R$) of 12.799863 MHz.

TABLE A

| $V_{FS}$ (Volts) | $F_R$ (MHz) |
|---|---|
| 0.8 | 12.799863 |
| 1.0 | 12.799882 |
| 1.2 | 12.799898 |
| 1.4 | 12.799915 |
| 1.6 | 12.799930 |
| 1.8 | 12.799945 |
| 2.0 | 12.799958 |
| 2.2 | 12.799973 |
| 2.4 | 12.799984 |
| 2.6 | 12.799998 |
| 2.8 | 12.800011 |
| 3.0 | 12.800023 |
| 3.2 | 12.800035 |
| 3.4 | 12.800047 |
| 3.6 | 12.800054 |
| 3.8 | 12.800071 |
| 4.0 | 12.800082 |
| 4.2 | 12.800094 |

As shown in FIG. 6, the first step 150 in characterizing the VCO 103 is to retrieve a data record from a set of characterization data for the VCO 103, such as Table A. The data record includes a frequency setting voltage ($V_{FS}$) and a resulting reference frequency ($F_R$). Once the data record is retrieved, a parts per million frequency deviation value (PPM) is determined in step 151 using the retrieved data record. The parts per million frequency deviation values (PPM) are calculated by using the following equation:

$$PPM = ((F_R - F_N)/F_N) * 1{,}000{,}000 \qquad \text{(Eqn. 1)}$$

wherein:

PPM is the parts per million frequency deviation;

$F_R$ is the retrieved reference frequency; and $F_N$ is the VCO 103 nominal frequency.

Once the parts per million frequency deviation (PPM) is calculated, a set of seven sum values (S1–S7) are calculated in step 152. These sum values are calculated according to the following equations:

$$S1 = S1 + PPM \quad \text{(Eqn. 2)}$$

$$S2 = S2 + PPM*PPM \quad \text{(Eqn. 3)}$$

$$S3 = S3 + PPM*PPM*PPM \quad \text{(Eqn. 4)}$$

$$S4 = S4 + PPM*PPM*PPM*PPM \quad \text{(Eqn. 5)}$$

$$S5 = S5 + V \quad \text{(Eqn. 6)}$$

$$S6 = S6 + PPM*V \quad \text{(Eqn. 7)}$$

$$S7 = S7 + PPM*PPM*V \quad \text{(Eqn. 8)}$$

wherein:
S1 is the first sum value;
S2 is the second sum value;
S3 is the third sum value;
S4 is the fourth sum value;
S5 is the fifth sum value;
S6 is the sixth sum value;
S7 is the seventh sum value;
PPM is the most recently calculated PPM value; and
V is the most recently retrieved frequency setting voltage ($V_{FS}$) value retrieved in step 150.

Prior to the first pass through step 151 all of the S1–S7 values are set to zero.

Once the sum values (S1–S7) are calculated, a determination is made in step 153 of whether another data record is to be retrieved from the characterization data set for the VCO 103. If more data is to be retrieved, then step 150 and the steps following thereafter are repeated. If no more data is to be retrieved, then a set of five partial coefficients (P1–P5) are calculated in step 154. These partial coefficients (P1–P5) are calculated according to the following equations:

$$P1 = N*S2 - S1*S1 \quad \text{(Eqn. 9)}$$

$$P2 = N*S7 - S2*S5 \quad \text{(Eqn. 10)}$$

$$P3 = N*S3 - S1*S2 \quad \text{(Eqn. 11)}$$

$$P4 = N*S6 - S1*S5 \quad \text{(Eqn. 12)}$$

$$P5 = N*S4 - S2*S2 \quad \text{(Eqn. 13)}$$

wherein:
P1 is the first partial coefficient;
P2 is the second partial coefficient;
P3 is the third partial coefficient;
P4 is the fourth partial coefficient;
P5 is the fifth partial coefficient; and
N is the number of data records retrieved in determining the sum values (S1–S7).

Prior to the first pass through step 154 all of the P1–P5 values are set to zero.

Once the partial coefficients (P1–P5) have been calculated, the coefficients for a quadratic equation expressing the VCO's frequency setting voltage ($V_{FS}$) in terms of parts per million frequency deviation (PPM) in the VCO's reference frequency ($F_R$) are determined in step 155. The coefficients are calculated as follows:

$$C = (P1*P2 - P3*P4)/(P1*P5 - P3*P3) \quad \text{(Eqn. 14)}$$

$$B = (P4 - C*P3)/P1 \quad \text{(Eqn. 15)}$$

$$A = (S5 - C*S2 - B*S1)/N \quad \text{(Eqn. 16)}$$

As a result, the VCO's frequency setting voltage ($V_{FS}$) can be expressed in terms of the parts per million frequency deviation (PPM) of the VCO's reference frequency ($F_R$) from the VCO's nominal frequency ($F_N$) as follows:

$$VFS = A + B*(PPM) + C*(PPM)^2 \quad \text{(Eqn. 17)}$$

wherein:
A is a constant;
B is a first order coefficient; and
C is a second order coefficient.

In determining which of the data records from Table A will be retrieved in step 150, the desired span of possible parts per million deviation in the VCO's reference frequency is considered. In one embodiment of the present invention, the VCO 103 has the characteristics set forth in Table A, and the data records retrieved in step 150 are those with frequency setting voltages ($V_{FS}$) in the range of 2.0 to 3.4 volts.

Figure 7:
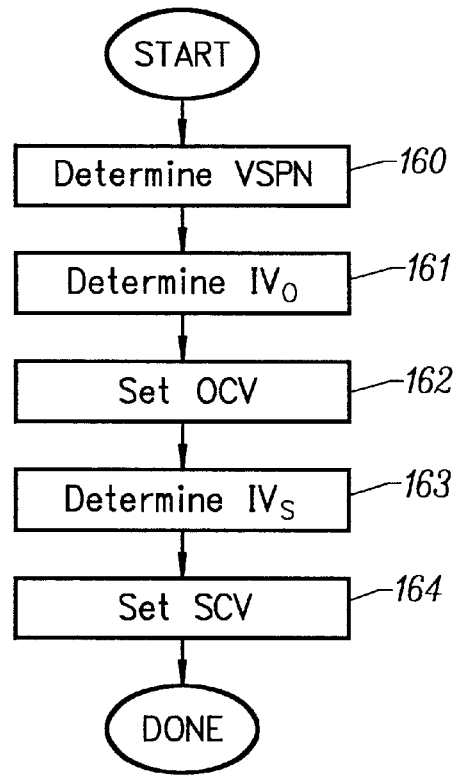
FIG. 7 illustrates a sequence of operations for setting a source control value and offset control value for the frequency references shown in FIGS. 2 and 3 in accordance with the present invention.

FIG. 7 illustrates a sequence of operations for setting the programmable voltage generator 104 offset control value (OCV) and source control value (SCV) (step 141, FIG. 5), during the initial configuration (step 130, FIG. 4). First, a determination of a voltage span value (VSPN) is made in step 160. The voltage span value defines the magnitude of the voltage range for the scaled control voltage ($V_{SC}$). The voltage span value is calculated according to the following equation:

$$VSPN = S*B \quad \text{(Eqn. 18)}$$

wherein:
VSPN is the voltage span value; and
S is a spanning multiplier.

In one embodiment of the present invention, the spanning multiplier (S) is equal to 1.1.

Once the voltage span value (VSPN) is determined in step 160, an ideal offset voltage is calculated in step 161. In one embodiment of the present invention, the ideal offset voltage is calculated according to the following equation:

$$IV_O = X*(A - V_{AD} - (VSPN/2)) \quad \text{(Eqn. 19)}$$

wherein:
$IV_O$ is the ideal offset voltage; and
$V_{AD}$ is a sum of all voltages provided to the voltage adder 113, except the scaled control voltage ($V_{SC}$) and the scaled offset voltage ($V_{SO}$).

For the programmable voltage divider 104 shown in FIGS. 2 and 3, $V_{AD}$ is equal to the fixed voltage $V_F$. In one embodiment of the present invention, the offset scaling divisor (X) is equal to 2.78. In an alternate embodiment of the present invention, the output of the offset voltage divider 115 is directly connected to the voltage adder 113, thereby causing the offset scaling divisor (X) to equal 1.

Once the ideal control voltage is determined, the offset control value (OCV) is set in step 162, based on the ideal offset voltage. In one embodiment of the present invention, the offset control value is calculated according to the following equation:

$$\text{OCV} = \text{INT}(M + IV_O*(\text{OCVM}/V_{OR})) \qquad \text{(Eqn. 20)}$$

wherein:

M is a rounding constant; and

OCVM is a maximum possible value for the offset control value.

In one embodiment of the present invention, the maximum possible value for the offset control value (OCVM) is 256 and the offset reference voltage ($V_{OR}$) is 5 volts. In such an embodiment, the M rounding constant is 0.50.

As used throughout this application, INT is a syntax for an operation that provides the truncated integer value for a value within a set of parentheses following the INT command. For example, in Equation 20, the INT operation determines the truncated integer value for the sum of M, $IV_O$, and ($\text{OCVM}/V_{OR}$).

After the offset control value (OCV) is set, an ideal source voltage is determined in step 163. In one embodiment of the present invention, the ideal source voltage is calculated according to the following equation.

$$IV_S = Y * \text{VSPN} \qquad \text{(Eqn. 21)}$$

wherein:

$IV_S$ is the ideal source voltage.

In one embodiment of the present invention, the control scaling divisor (Y) is equal to 8. In an alternate embodiment of the present invention, the output of the control voltage divider 111 is directly connected to the voltage adder 113, thereby causing the control scaling divisor (Y) to equal 1.

After calculating the ideal source voltage, the source control value (SCV) is set in step 164, based on the ideal source voltage. The source control value is calculated according to the following equation:

$$\text{SCV} = \text{INT}(M + IV_S * \text{SCVM}/V_{SR}) \qquad \text{(Eqn. 22)}$$

wherein:

M is a rounding constant; and

SCVM is the maximum possible value for the source control value.

In one embodiment of the present invention, the maximum possible source control value (SCVM) is 256, and the source reference voltage is 5 volts. In such an embodiment, the M rounding constant is 0.50.

Once the source control value is set in step 164, the process of setting the offset control value and source control value is done.

In embodiments of the present invention, the step 141 of setting the offset control value (OCV) and source control value (SCV), as illustrated in FIGS. 5 and 7, is performed by the voltage control engine 105 in response to a processing unit readable set of instruction. In such an embodiment, the step 162 of setting the offset control value (OCV) includes the voltage control engine 105 calculating the offset control value and writing the offset control value to the offset voltage divider 115 via the offset data latch 116. Further, the step 164 of setting the source control value (SCV) includes the voltage control engine 105 calculating the source control value and writing the source control value to the source voltage divider 110 via the source data latch 118.

Figure 8:
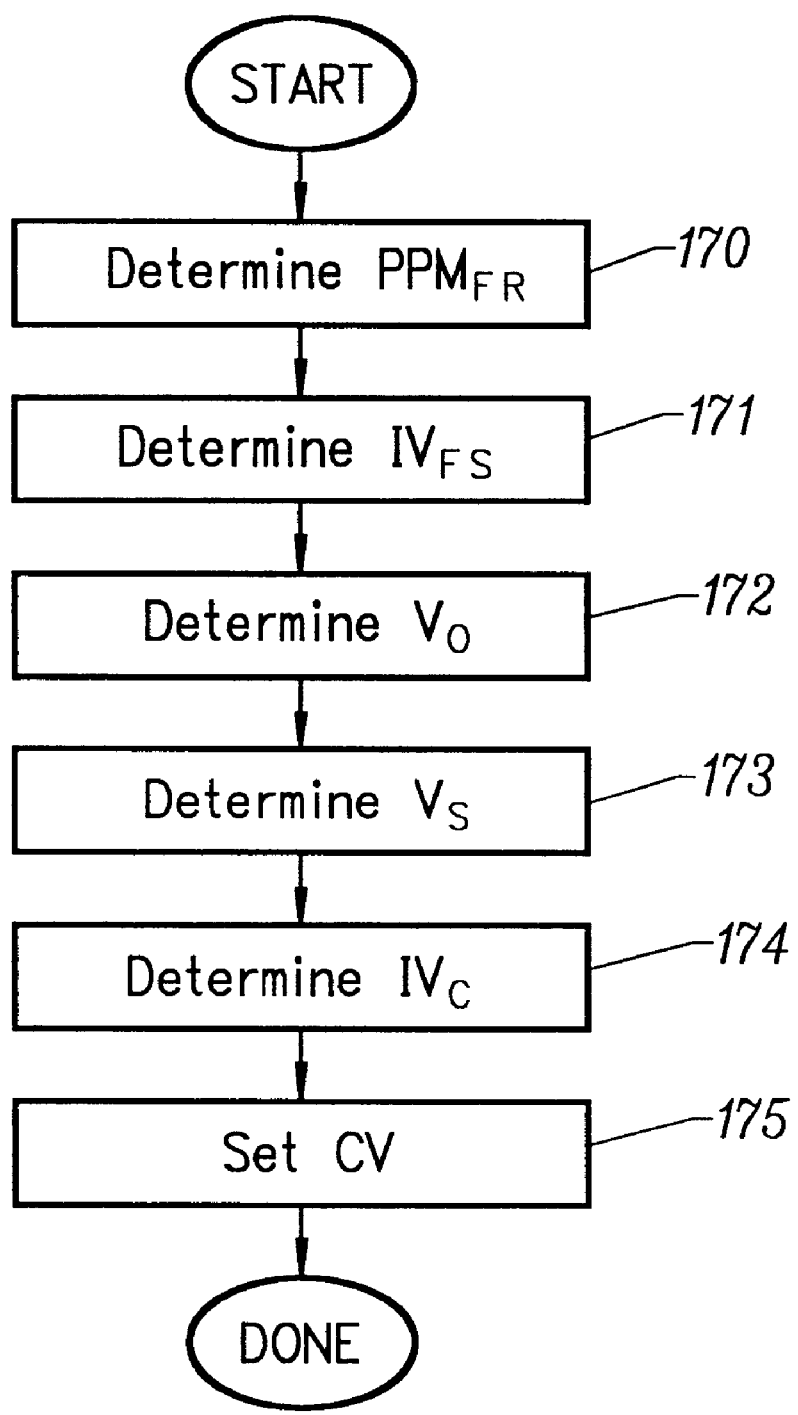
FIG. 8 illustrates a sequence of operations for setting the reference frequency for the frequency references shown in FIGS. 2 and 3 in accordance with the present invention.

FIG. 8 illustrates a sequence of operations for setting the reference frequency (step 134) in one embodiment of the present invention, as discussed above with respect to FIG. 4. Initially, the desired reference frequency ($F_R$) parts per million deviation from the VCO's nominal frequency ($F_N$) is determined in step 170. The reference frequency part per million deviation is determined so that the reference frequency ($F_R$) will offset frequency error that, is caused by frequency modification circuitry within the signal synthesizer 100. In one embodiment of the present invention, the reference frequency part per million deviation is calculated according to the following equation:

$$\text{PPM}_{FR} = (F_{ERR}/F_O) * 1{,}000{,}000 \qquad \text{(Eqn. 23)}$$

wherein:

$\text{PPM}_{FR}$ is the reference frequency ($F_R$) parts per million deviation from the VCO's nominal frequency ($F_N$); and $F_{ERR}$ is the frequency error introduced by the signal synthesizer's frequency modification circuitry.

Once the parts per million deviation ($\text{PPM}_{FR}$) is determined, an ideal frequency setting voltage is determined in step 171. The ideal frequency setting voltage is determined according to the following equation:

$$IV_{FS} = A + B*(\text{PPM}_{FR}) + C*(\text{PPM}_{FR})^2 \qquad \text{(Eqn. 24)}$$

wherein:

$IV_{FS}$ is the ideal frequency setting voltage.

Once the ideal frequency setting voltage is determined, the offset voltage ($V_O$) provided by the offset voltage divider 115 is determined in step 172. The offset voltage is determined according to the following equation:

$$V_O = V_{OR} * (\text{OCV}/\text{OCVM}) \qquad \text{(Eqn. 25)}$$

After the offset voltage ($V_O$) is determined, the source voltage ($V_S$) provided by the source, voltage divider 110 is determined in step 173. The source voltage is determined according to the following equation:

$$V_S = V_{SR} * (\text{SCV}/\text{SCVM}) \qquad \text{(Eqn. 26)}$$

Next, an ideal control voltage is determined in step 174. The ideal control voltage is determined by calculating the ideal scaled control voltage and multiplying the ideal scaled control voltage by the control scaling divisor (Y). The ideal scaled control voltage can be determined by subtracting all of the voltages being provided to the voltage adder 113 (FIG. 2), except the scaled control voltage ($V_{SC}$), from the ideal frequency setting voltage ($IV_{FS}$). In one embodiment of the present invention, the ideal control voltage is calculated according to the following equation:

$$IV_C = Y * (IV_{FS} - V_{AV}) \qquad \text{(Eqn. 27)}$$

wherein:

$IV_C$ is the ideal control voltage; and $V_{AV}$ is a sum of all voltages provided to the voltage adder 113, except the scaled control voltage ($V_{SC}$).

In one embodiment of the present invention, the sum ($V_{AV}$) of all voltages being provided to the voltage adder, except the scaled control voltage, is calculated according to the following equation:

$$V_{AV} = V_F + (V_O/X) \qquad \text{(Eqn. 28)}$$

After the ideal control voltage is determined, the control value is set in step 175. By setting the control value, the frequency setting voltage ($V_{FS}$) will be set, which in turn will cause the reference frequency ($F_R$) of the VCO 113 to be set. In one embodiment of the present invention, the setting of the control value 175 includes determining the control value (CV) according to the following equation:

$$CV=INT(M+IV_C*(CVM/V_S)) \quad \text{(Eqn. 29)}$$

wherein:

M is a rounding constant; and

CVM is a maximum possible value for the control value.

In one embodiment of the present invention, the maximum possible value for the control value is 4096 and the M rounding constant is 0.50.

In further embodiments of the present invention, the voltage control engine 105 performs the sequence of operations shown in FIG. 8 for setting the reference frequency 134 (FIG. 4). In such an embodiment, the step 175 of setting the control value (CV) includes the voltage control engine 105 calculating the control value and providing the control value to the control voltage divider 111. Once the control value is set in step 175, the process of setting the reference frequency ($F_R$) is done.

Figure 9:
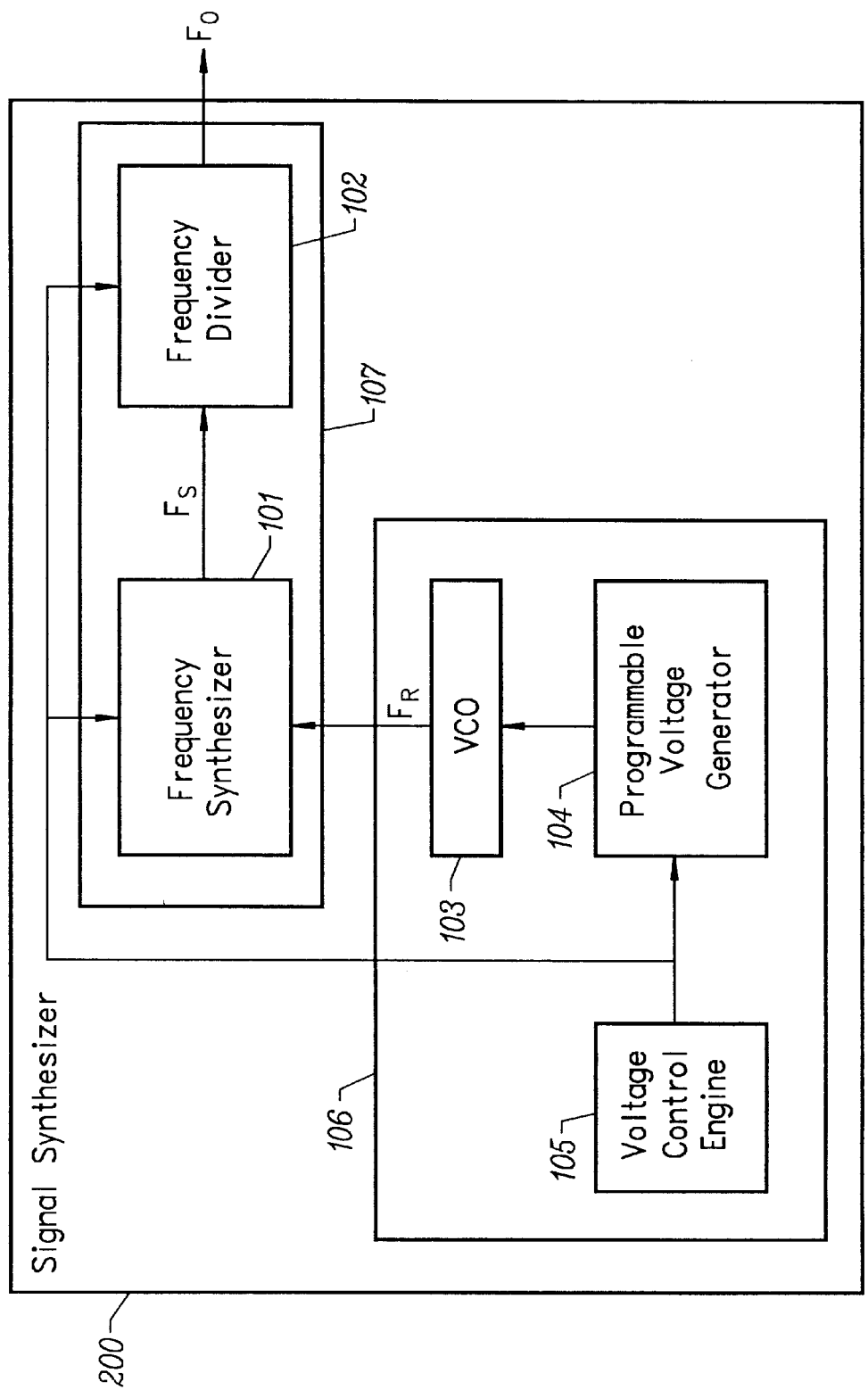
FIG. 9 illustrates a signal synthesizer in an alternate embodiment of the present invention.
Figure 10:
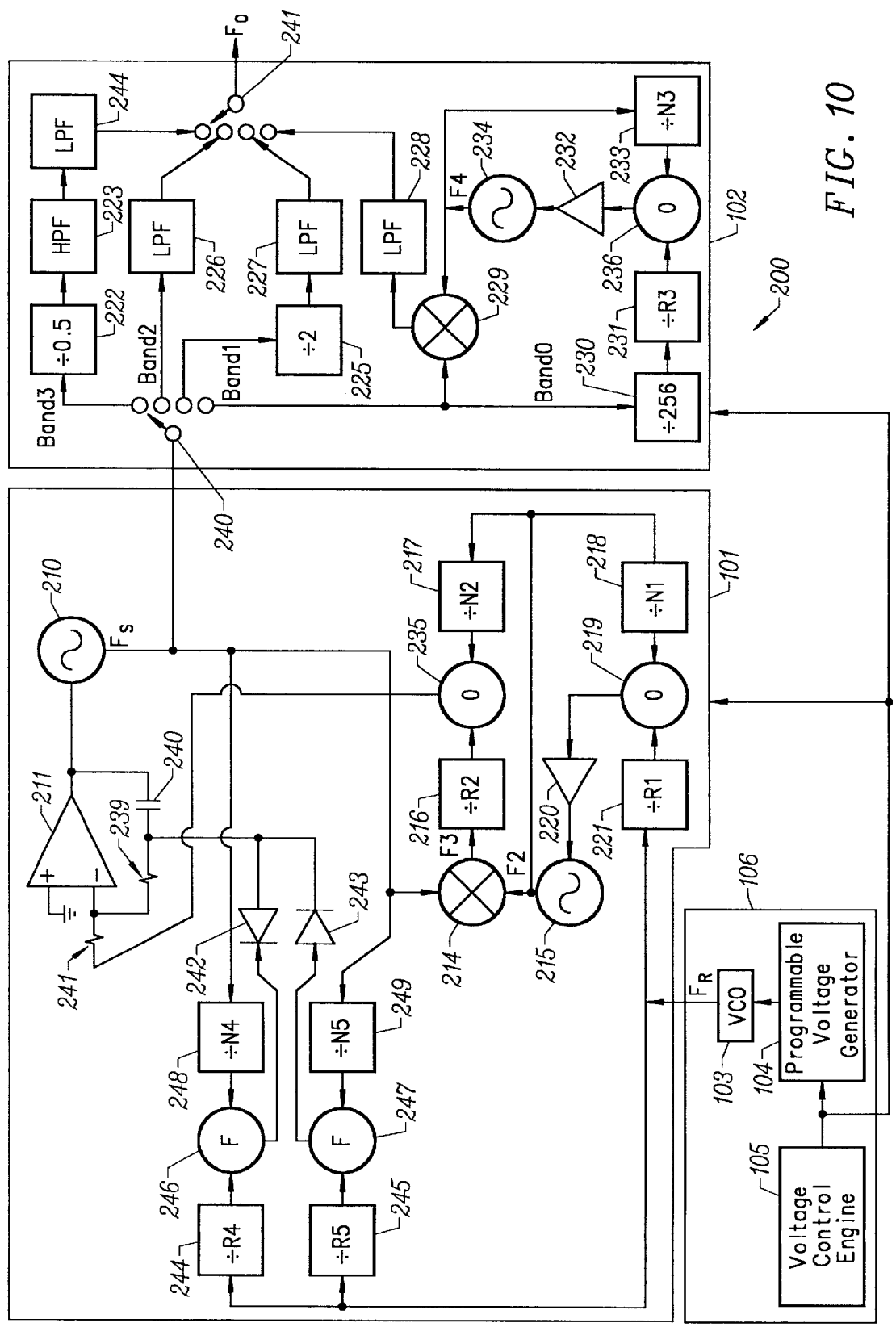
FIG. 10 illustrates a more detailed design of the signal synthesizer shown in FIG. 9.

As described above, with respect to FIG. 4, the frequency modification circuitry 107 (FIG. 1) is configured prior to setting the reference frequency (step 134, FIG. 4). FIGS. 9 and 10 illustrate a signal synthesizer 200, in accordance with the present invention, in which the frequency modification circuitry 107 can be configured. FIGS. 11–17 illustrate a process for configuring such frequency modification circuitry 107.

The single synthesizer 200 shown in FIG. 9 is the same as the signal synthesizer 100 shown in FIG. 1, except that the voltage control engine 105 is also coupled to the frequency synthesizer 101 and frequency divider 102 in the frequency modification circuitry 107. The voltage control engine 105 is so coupled to provide for configuring the frequency synthesizer 101 and frequency divider 102 for providing a desired output frequency ($F_O$).

FIG. 10 shows a more detailed illustration of the signal synthesizer 200 shown in FIG. 9. The signal synthesizer 200 in FIG. 10 can be configured to have an output frequency ($F_O$) in the range of 1 MHz to 3.5 GHz, with a frequency resolution of less than 1 Hz and a settling time of less than 50 microseconds, when VCO 103 has a nominal frequency ($F_N$) of 12.8 MHz. The frequency resolution is defined by the change in $F_O$ that results from changing the voltage setting value provided to the programmable voltage generator 104 by the smallest possible value. The settling time is defined by the settling time for the lowest frequency phase detector 235, 219, and 236.

In order to achieve the above-described results, the signal synthesizer 200 in FIG. 10 in one embodiment of the present invention has the following constraints: $F_S$ is in a range of 1–2 GHz; F3 is in a range of 10.5–11.5 MHz; F2 is in a range of 1010.726–1989.486 MHz; F4 is in a range of 1000.98–1998.05 MHz; the frequency at phase detector 219 is in a range of 217–474 KHz; the frequency at phase detector 235 is in a range of 219–460 KHz; the frequency at phase detector 236 is in a range of 977–1953 KHz; R2 is in a range of 25–50; N2 is in a range of 4239–4828; R1 is in a range of 27–59; N1 is in a range of 4121–6176; R3 is 4; N3 is in a range of 768–1280; $V_F$ is equal to 1.8 volts, X is equal to 2.78; Y is equal to 8; CVM is equal to 4096; OCVM is equal to 256; and SCVM is equal to 256.

The signal synthesizer 200 shown in FIG. 10 includes a frequency reference 106, with the voltage control engine 105 coupled to the frequency synthesizer 101 and frequency divider 102. The voltage control engine 105 is coupled to the frequency synthesizer 101 to provide the following frequency divisor values for frequency dividers 218, 221, 217, and 216: N1, R1, N2 and R2. The voltage control engine 105 is also coupled to provide the following frequency divisor values for presteering circuitry frequency dividers 248, 244, 249, and 245: N4, R4, N5, and R5. The voltage control engine 105 is further coupled to the frequency divider 102 to provide the following frequency divisor values for frequency dividers 231 and 233: R3 and N3. The voltage control engine 105 also provides for the selection of either band 0, band 1, band 2 or band 3 of the frequency divider 102.

As shown in FIG. 10, the reference frequence ($F_R$) output of the frequency reference 106 is coupled to the input of frequency divider 221 which is part of the variable R synthesizer formed by frequency divider 221, frequency divider 218, phase detector 219, amplifier 220 and voltage controlled oscillator 215. The outputs of frequency divider 221 and frequency divider 218 are coupled to the inputs of phase detector 219, which ensures that the two input frequencies are equal. The phase detector 219 has an output coupled to the input of amplifier 220. Amplifier 220 has an output coupled to the input of the voltage controlled oscillator 215, which has an output that provides a signal with a frequency F2. Frequency F2 can be expressed as follows:

$$F2=F_R*(N1/R1) \quad \text{(Eqn. 30)}$$

wherein:

$F_R$ is the reference frequency;

N1 is the frequency divisor value for frequency divider 218; and

R1 is the frequency divisor value for frequency divider 221.

The output of voltage control oscillator 215 is coupled to the input of frequency divider 218, the input of mixer 214, and the input of a frequency divider 217. Frequency divider 217 has an output coupled to the input of phase detector 235. The phase detector 235 has another input coupled to the output of a frequency divider 216, which has an input coupled to the output of mixer 214.

The output of the phase detector 235 is coupled to the negative input of an operational amplifier 211 through resistor 241, which has a value in the range of 2000 Ω to 5000 Ω. The negative input and output of the amplifier are coupled through feedback resistor 239 and capacitor 240. The values of these components are in ranges of 500–750 Ω (239) and 1–10 nanofarads (240). The output of the amplifier 211 is coupled to the input of a voltage control oscillator 210, which has an output forming the output of the frequency synthesizer 101 for providing synthesizer frequency $F_S$.

The output of voltage controlled oscillator 210 is coupled to the input of mixer 214, which provides an output signal having the frequency F3. The F3 frequency is expressed as follows for $F_S$ spanning on octave from 1000 MHz to 2000 MHz:

$$F3=F_S-F2, \text{ if } 1600 \text{ MHz} \leq F_S < 2000 \text{ MHz; and}$$

$$F3=F2-F_S, \text{ if } 1000 \text{ MHz} \leq F_S \leq 1600 \text{ MHz.} \quad \text{(Eqn. 31)}$$

The $F_3$ frequency can also be expressed as follows:

$$F_3=F_2*(R2/N2) \quad \text{(Eqn. 32)}$$

wherein:

R2 is the frequency divisor value for frequency divider 216; and

N2 is the frequency divisor value for frequency divider 217.

Accordingly, $F_S$ can be expressed as follows:

$$F_S = (F_R*(N1/R1))*(1-(R2/N2)),$$

if 1000 MHz ≤ $F_S$ ≤ 1600 MHz; and $$F_S = (F_R*(N1/R1))*(1+(R2/N2)),$$

if 1600 MHz < $F_S$ ≤ 2000 MHz. (Eqn. 33)

The output of voltage control oscillator 210 is also coupled to the input of the frequency divider 102.

A presteer circuitry ensures that voltage control oscillator 210 locks onto a desired initial frequency. The presteer circuitry includes frequency dividers 244 and 245, which are each coupled to receive the reference frequency ($F_R$) and divide the reference frequency by divisors R4 and R5, respectively. Presteer frequency dividers 248 and 249 are each coupled to receive synthesizer frequency ($F_S$) and divide it by divisors N4 and N5, respectively. The outputs of frequency dividers 244 and 248 are coupled to inputs of frequency comparator 246, and the outputs of dividers 245 and 249 are coupled to the inputs of frequency comparator 247. Comparator 246 provides an output that is asserted when the output from divider 244 (R4) is less than the output from divider 248 (N4). Comparator 247 provides an output that is asserted when the output from divider 245 (R5) is greater than the output from divider 249 (N5).

The output of frequency comparator 246 is coupled to the cathode of diode 242, and the output of comparator 247 is coupled to the anode of diode 243. The anode of diode 242 and the cathode of diode 243 are each coupled to the input of amplifier 211 through resistor 239 and to the output of amplifier 211 through capacitor 240. The positive terminal of amplifier 211 is coupled to ground.

The frequency divider 102 receives the synthesizer frequency ($F_S$) and couples it to one of four bands (band 0, band 1, band 2, and band 3) in the frequency divider 102. The frequency divider 102 provides the output frequency ($F_O$) for the signal synthesizer on the output of the selected band.

The input to band 3 is the input to a frequency divide by 0.50 circuit 222, which has an output coupled to the input of a high pass filter 223. The output of the high pass filter 223 is coupled to the input of a low pass filter 224, which has an output forming the output of band 3. The input to band 2 is the input of a low pass filter 226, which has an output forming the output of band 2. The input to band 1 is the input to a frequency divide by 2 circuit 225, which has an output coupled to the input of a low pass filter 227. The output of the low pass filter forms the output of band 1.

Band 0 is employed to provide frequency divisors other than those that are provided by bands 1, 2, and 3. Band 0 includes a divide by 256 frequency divider 230 which receives the band 0 input. The output of the 256 frequency divider 230 is provided to an input of a frequency divider 231. Frequency divider 231 has an output coupled to an input of a phase comparator 236. The phase comparator 236 has another input coupled to the output of frequency divider 233. The output of the phase comparator 236 is coupled to the input of an amplifier 232. The output of the amplifier 232 is coupled to the input of a voltage controlled oscillator 234, which has an output coupled to both the input of frequency divider 233 and an input of mixer 229. The output of VCO 234 provides a signal with a frequency F4, which can be expressed as follows:

$$F4 = F_S*(N3/(256*R3))$$ (Eqn. 34)

wherein:

N3 is a frequency divisor value for frequency divider 233; and

R3 is a frequency divisor value for frequency divider 231.

Mixer 229 has another input, which is coupled to receive the band 0 input. The output of mixer 229 is coupled to an input of a low pass filter 228, which has an output providing the output of band 0. As a result, the $F_O$ output frequency is equal to the absolute value of $F_S$–F4. A detailed description of a programmable frequency divider for use in implementing the band 0 is set forth in U.S. patent application Ser. No. 08/847,672.

In order to provide for selecting an appropriate band within the frequency divider 102, the frequency divider includes 2 switches 240, 241. Input switch 240 has an input terminal that is coupled to the frequency synthesizer 101 output to receive the synthesizer frequency $F_S$ and a switching terminal that is selectively coupleable to the input of any one of band 0, 1, 2, and 3. Switch 241 has an output terminal that provides the signal synthesizer output frequency ($F_O$) and a switching terminal that is selectively coupleable to the output of any one of bands 0, 1, 2, and 3.

Figure 11:
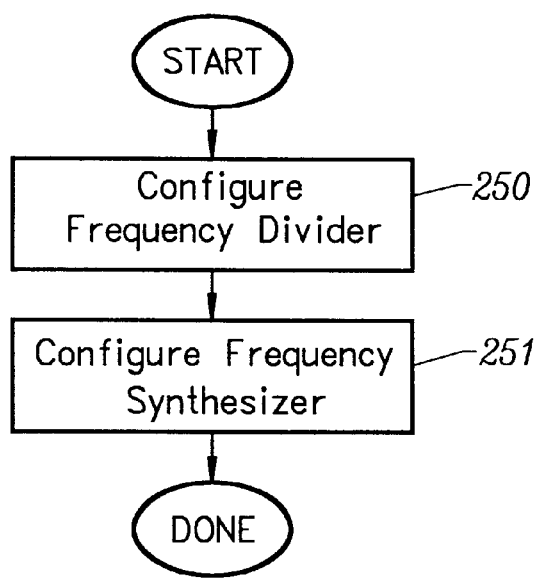
FIG. 11 illustrates a sequence of operations for configuring the frequency modification circuitry for the signal synthesizer shown in FIG. 10 in one embodiment of the present invention.

FIG. 11 illustrates a sequence of operations for configuring the frequency modification circuitry (step 132, FIG. 4) for the signal synthesizer 200 shown in FIG. 10. As a first step, the frequency divider 102 is configured in step 250. The frequency divider 102 is configured by selecting the appropriate band and calculating and loading the R3 and N3 values, if band 0 is selected. Once the frequency divider 102 is configured, the frequency synthesizer 101 is configured in step 251. The frequency synthesizer 101 is configured by calculating and loading values for the following variables in the frequency synthesizer 101: N4, R4, N5, R5, R2, N2, N1, and R1. In one embodiment of the present invention, the sequence of operations shown in FIG. 11 is performed by the voltage control engine 105 in response to a set of instructions.

Figure 12:
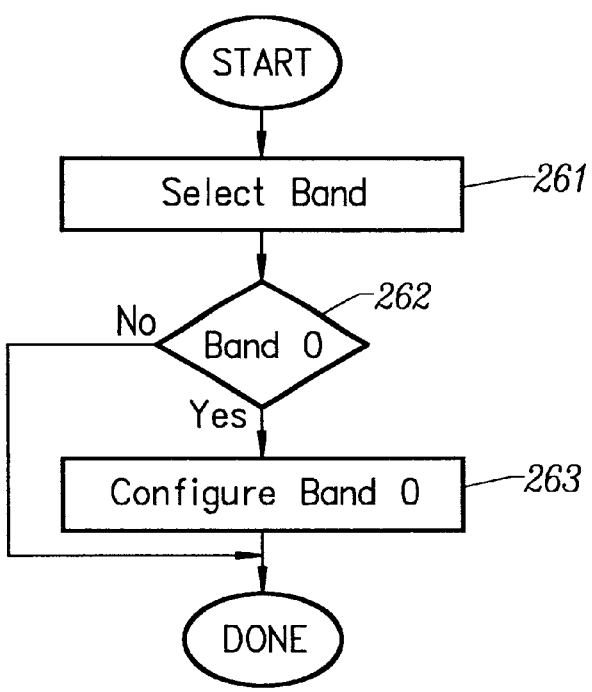
FIG. 12 illustrates a sequence of operations for configuring the frequency divider shown in FIG. 10 in one embodiment of the present invention.

FIG. 12 illustrates a sequence of operations for performing the frequency divider 102 configuration (step 250 in FIG. 11). First, the appropriate band is selected in step 261, based on the desired output frequency ($F_O$) for the signal synthesizer 200. Once the band is selected, a determination is made in step 262 of whether band 0 was selected in step 261. If it is determined that band 0 was not selected, then the process of configuring the frequency divider 102 is done. Otherwise, band 0 is configured in step 263. Once band 0 is configured, the configuration of the frequency divider 102 is done.

Figure 13:
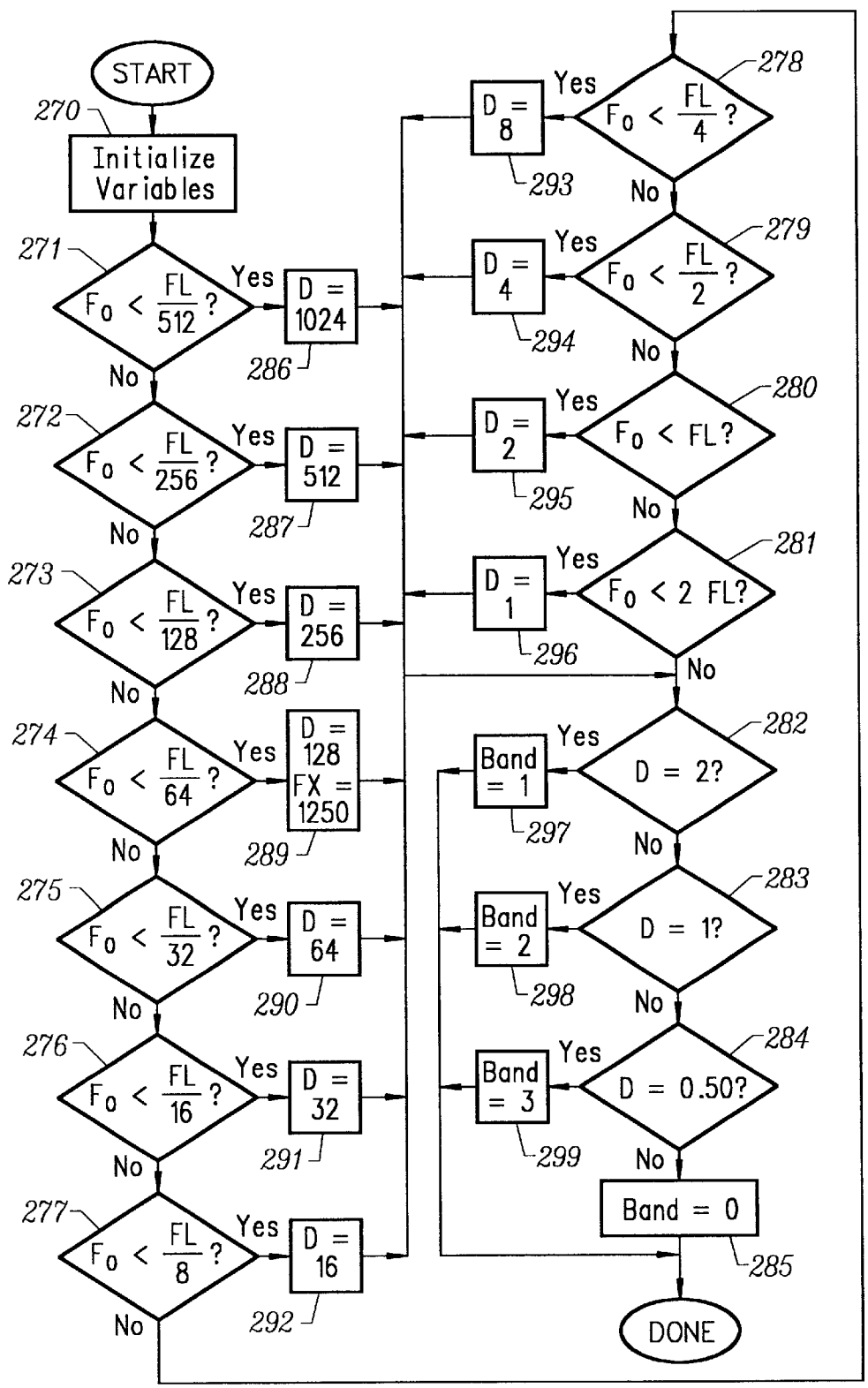
FIG. 13 illustrates a sequence of operations for selecting a band for the frequency divider shown in FIG. 10.

FIG. 13 illustrates a sequence of operations that are employed in one embodied in the present invention for performing the band selection step 261 described above with reference to FIG. 12. A set of variables are initialized in step 270. The variables include a nominal synthesizer frequency (FX), a minimum synthesizer frequency (FL), and a divisor value (D) for frequency divider 102. In one embodiment of the present invention the variables are initialized as follows:

FX=1500 MHz,

FL=1000 MHz, and

D=0.50.

Once the variables are set, a determination is made in step 271 of whether the desired output frequency ($F_O$) for the signal synthesizer 200 is less than the quotient of FL divided by 512, if the desired output frequency is less than the quotient, then the divisor value (D) is assigned a value of 1024 in step 286.

Otherwise, a determination is made in step 272 of whether the desired output frequency for the signal synthesizer 200 is less than the quotient of FL divided by 256 in step 272. If the desired output frequency is less than the quotient, then the divisor value is assigned a value of 512 in step 287.

Otherwise, a determination is made in step 273 of whether the desired output frequency for the signal synthesizer 200 is less than the quotient of FL divided by 128. If the desired output frequency is less than the quotient, then the divisor value is assigned a value of 256 in step 288.

Otherwise a determination is made in step 274 of whether the desired output frequency for the signal synthesizer 200 is less than the quotient of FL divided by 64. If the desired output frequency is less than the quotient, then the divisor value is assigned a value of 128, and FX is assigned a value of 1250 MHz in step 289.

Otherwise, a determination is made in step 275 of whether the desired output for the signal synthesizer 200 is less than a quotient of FL divided by 32. If the desired output frequency is less than the quotient, then the divisor value is assigned a value of 64 in step 290.

Otherwise, a determination is made in step 276 of whether the desired output frequency is less than the quotient of FL divided by 16. If the desired output frequency is less than the quotient, then the divisor value is assigned a value of 32 in step 291.

Otherwise, a determination is made in step 277 of whether the desired output frequency for the signal synthesizer is less than a quotient of FL divided by 8. If the desired output frequency is less than the quotient, then the divisor value is assigned a value of 16 instead of 292.

Otherwise, a determination is made in step 278 of whether the output frequency for the signal synthesizer 200 is less than a quotient of FL divided by 4. If the desired output frequency is less than the quotient, then the divisor value is assigned a value of 8 in step 293.

Otherwise, a determination is made in step 279 of whether the desired output frequency for the signal synthesizer 200 is less than a quotient of FL divided by 2. If the desired output frequency is less than the quotient, then the divisor value is assigned a value of 4 in step 294.

Otherwise, a determination is made in step 280 of whether the desired output frequency for the signal synthesizer 200 is less than FL. If the desired output frequency is less than FL, then the divisor value is assigned a value of 2 in step 295.

Otherwise, a determination is made in step 281 of whether the desired output frequency for the signal synthesizer 200 is less than FL multiplied by 2. If the desired output frequency is less than FL multiplied by two, then the divisor value is assigned a value of 1 in step 296.

Otherwise, a determination is made in step 282 of whether the divisor value (D) is equal to 2. The determination being made in step 282 is also performed after each of the above-described steps of assigning a value to the divisor value (D) 286, 287, 288, 289, 290, 291, 292, 293, 294, 295, and 296.

If the divisor value (D) is determined to be equal to 2 in step 282, then band 1 of the frequency divider 101 is selected in step 297. Otherwise, a determination is made in step 283 of whether the divisor value is equal to 1. If the divisor variable is equal to 1, then band 2 of the frequency divider 102 is selected in step 298.

Otherwise, a determination is made in step 284 of whether the divisor value is equal to 0.50. If the divisor value is equal to 0.50, then band 3 of the frequency divider 102 is selected in step 299. Otherwise, band 0 of the frequency divider 102 is selected in step 285.

Once any one of the band selection steps 297, 298, 299, and 285 are performed, the process of selecting a band 261 (FIG. 12) in the frequency divider 102 is done. In performing the steps of selecting a band 297, 298, 299, 285, the switches 240, 241 in the frequency divider 102 are set so that both switches 240, 241 are coupled to the selected band. In one embodiment of the present invention, the switches 240, 241 are set by the voltage control engine 105.

Figure 14:
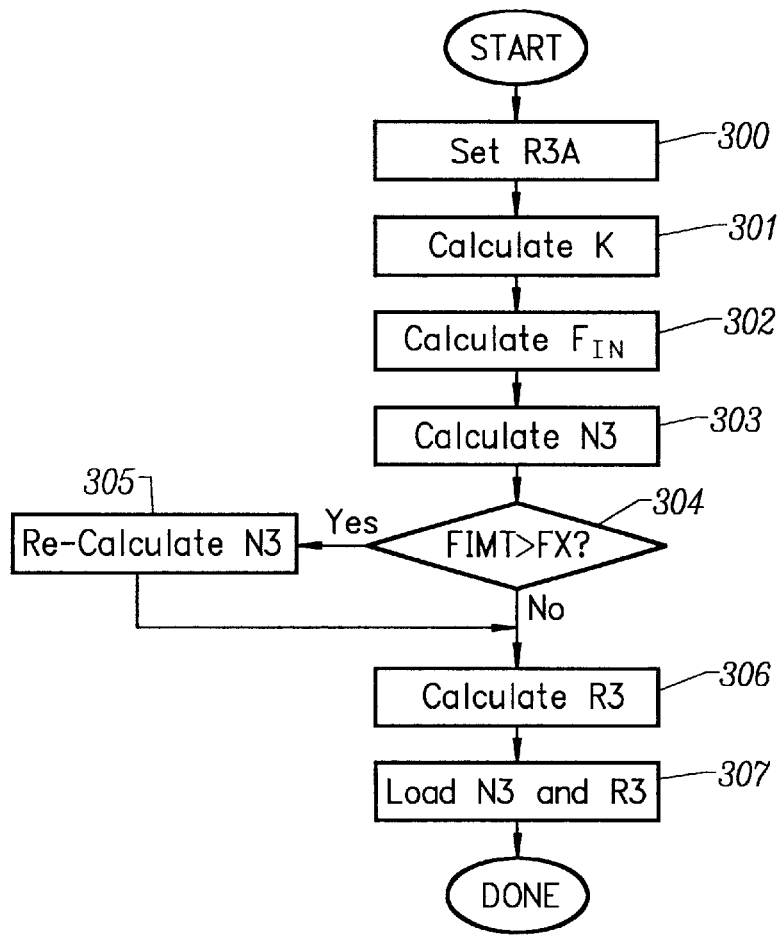
FIG. 14 illustrates a sequence of operations for configuring band 0 of the frequency divider shown in FIG. 10.

FIG. 14 illustrates a sequence of operations for configuring band 0 in the frequency divider 102. A default R3 value (R3A) is set for frequency divider 231 in step 300. The default R3 value (R3A) is set to 1024, in one embodiment of the present invention. Once the default R3A value is set, a holding constant (K) is calculated, in step 301, by dividing the R3A value by the divisor value (D) for the frequency divider 102.

Once the holding constant (K) is calculated, a frequency divider 102 input frequency ($F_{IN}$) is calculated in step 302. The $F_{IN}$ value is calculated by multiplying the desired signal synthesizer 200 (FIGS. 9 and 10) output frequency ($F_O$) by the frequency divider divisor value (D). After $F_{IN}$ is calculated, the N3 frequency divisor value for divider 233 (FIG. 10) is calculated in step 303. In step 303, N3 is set according to the following equation:

$$N3 = K*(D+1) \tag{Eqn. 35}$$

After the N3 value has been calculated in step 303, a determination is made in step 304 of whether the $F_{IN}$ frequency is greater than the value of FX. If $F_{IN}$ is greater than FX, then the N3 value is re-calculated in step 305. In step 305, N3 is calculated according to the following equation:

$$N3 = K+(D-1) \tag{Eqn. 36}$$

If $F_{IN}$ is determined not to be greater than FX or the N3 value is re-calculated in step 305, then the R3 frequency divisor value for frequency divider 231 (FIG. 10) is calculated in step 306. In one embodiment of the present invention, the R3 value is calculated as follows:

$$R3 = R3A/256 \tag{Eqn. 37}$$

After the R3 value is set in step 306, the values for R3 and N3 are loaded in frequency dividers 231 and 233, respectively, in step 307. After the R3 and N3 values are loaded, the process of configuring band 0 is done.

Figure 15:
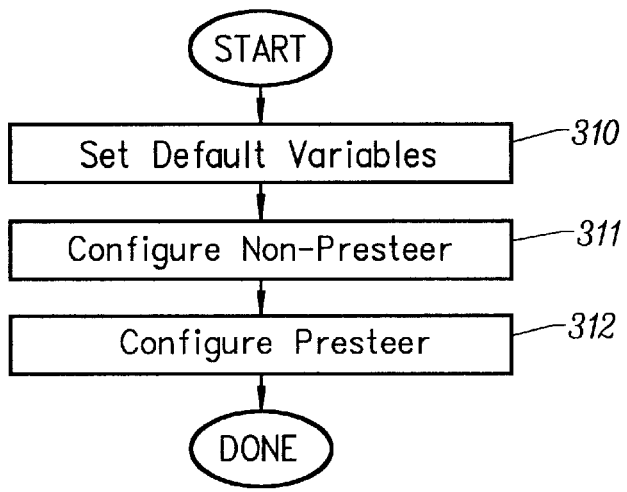
FIG. 15 illustrates a sequence of operations for configuring the frequency synthesizer shown in FIG. 10.

FIG. 15 illustrates a sequence of operations for configuring the frequency synthesizer 101 (step 251, FIG. 11). A set of default variables are set in step 310. These default variables include a default value for the F3 frequency (F3N), an N1 default value (NN), and a constant value (K1) equal to the product of NN and the nominal frequency ($F_N$) of the VCO 103. In one embodiment of the present invention, F3N is set to equal 11 MHz and NN is set to equal 4350.

Once the variables are set in step 310, the frequency divisor values (N1, R1, N2, and R2) for the non-presteering circuitry in the frequency synthesizer 101 are set in step 311. Next, the variables for the presteering circuitry in the frequency synthesizer 101 are set in step 312. These variables include N4, R4, N5, and R5. After the presteering variables have been set, the configuration of the frequency synthesizer 101 is complete.

Figure 16A:
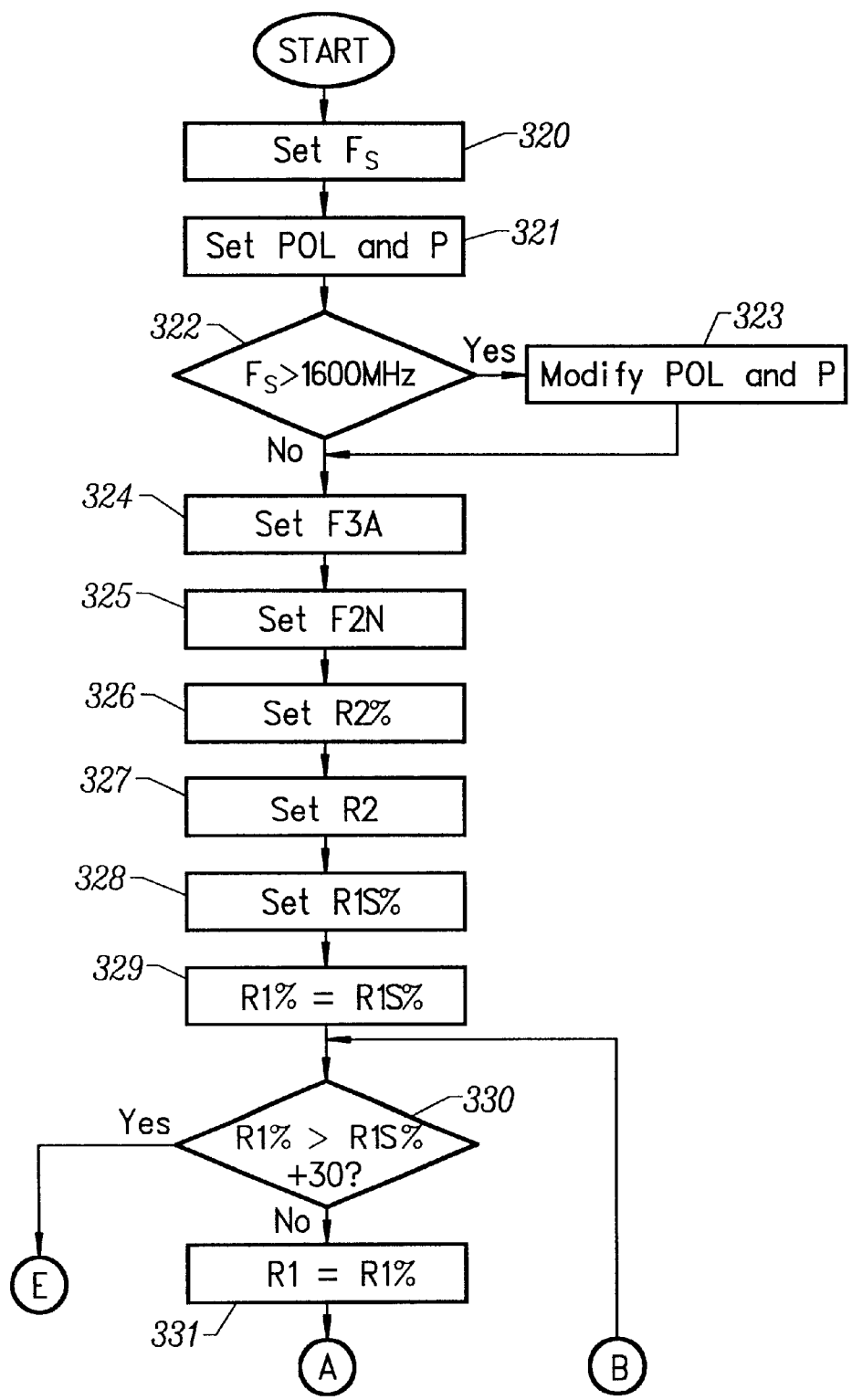
FIGS. 16A–16C illustrate a sequence of operations for configuring the non-presteering circuitry of the frequency synthesizer shown in FIG. 10.
Figure 16B:
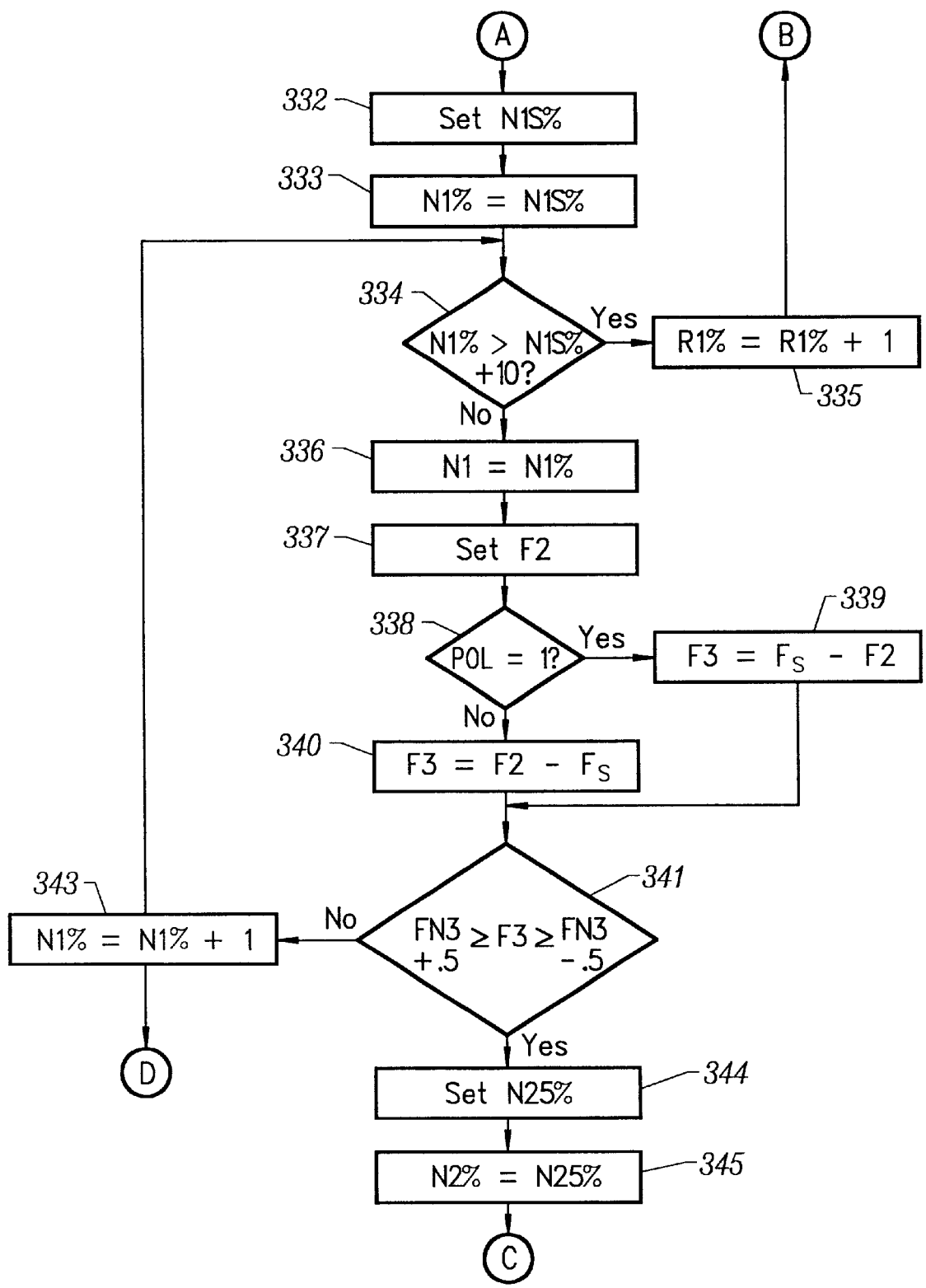
Figure 16C:
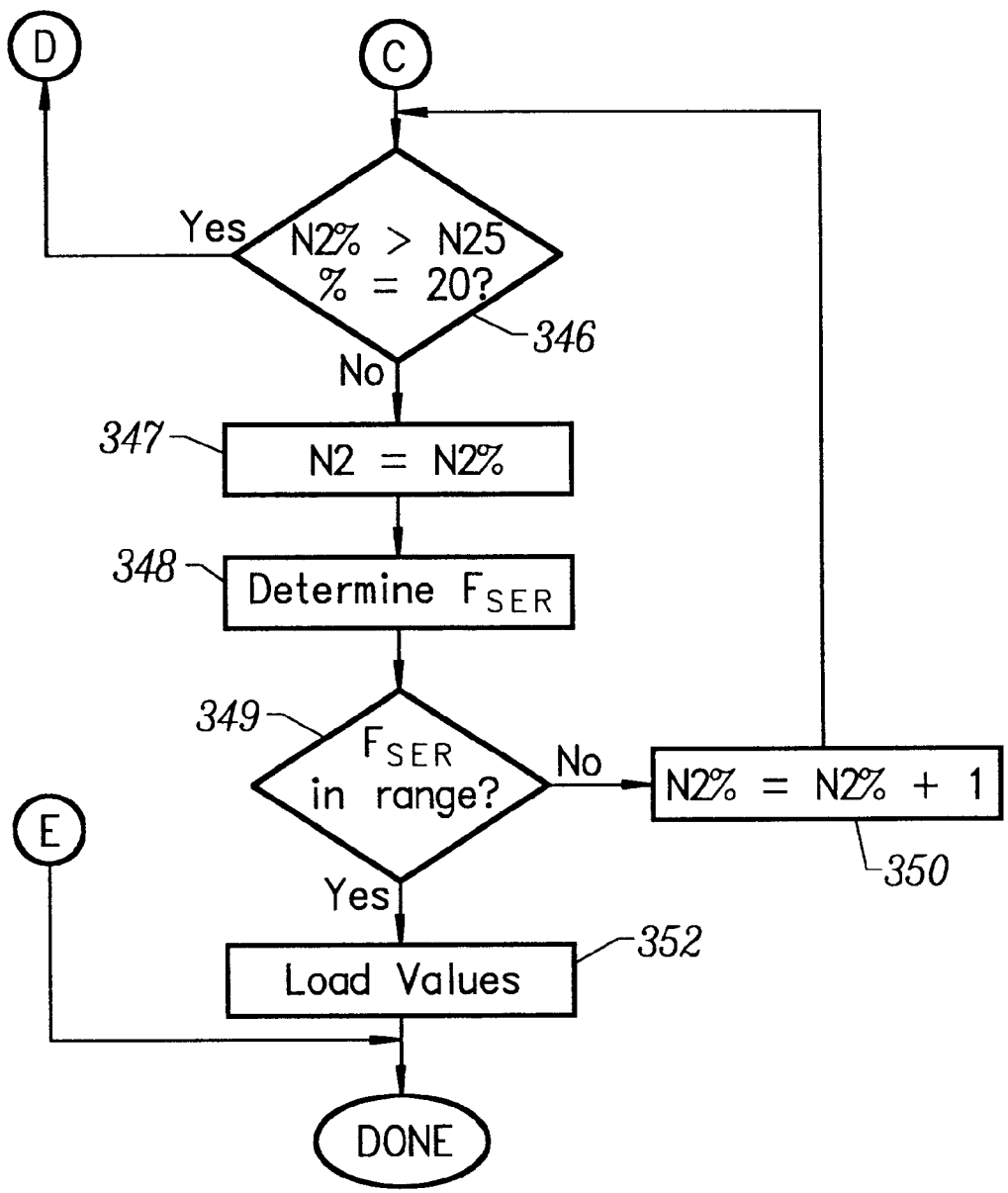

FIGS. 16A–16C illustrate a sequence of operations for determining the R2, N2, R1, and N1 frequency divisors in step 311 (FIG. 15), so that the frequency synthesizer 101 has a frequency error within a predetermined range. Initially, a value for F is set in step 320. The value for $F_S$ is set by multiplying the desired output frequency ($F_O$) for the signal synthesizer 200 by the divisor value (D) for the frequency divider 102. Once the $F_S$ value is set, polarity values POL and P are set in step 321. The POL value is set to −1 and the P value is set to 0.

Once the polarity values are set, a determination is made in step 322 of whether $F_S$ is greater than 1600 MHz. If $F_S$ is greater than 1600 MHz, then the polarity values are modified in step 323. In step 323, the POL value and P value are both set to 1. Once the polarity values are modified in step 323 or a determination is made that $F_S$ is not greater than 1600 MHz, then a preliminary F3 value (F3A) is set in step 324. The F3A value is set according to the following equation:

$$F3A=F3N+(POL*0.25 \text{ MHz})+0.05 \text{ MHz} \qquad \text{(Eqn. 38)}$$

Once F3A is set, a nominal F2 value (F2N) is set in step 325. The F2N value is set according to the following equation:

$$F2N=F_S-(POL*F3A) \qquad \text{(Eqn. 39)}$$

After F2N is set, a preliminary value for R2 (R2%) is set in step 326. The R2% value is set according to the following equation:

$$R2\%=5000/F_S \qquad \text{(Eqn. 40)}$$

Once the R2% value is established, the R2 value for frequency divider 216 is set to be equal to R2% in step 327. Once the R2 value is set in step 327, an initial preliminary R1 value (R1S %) is set in step 328. The R1S % value is set according to the following equation:

$$R1S\ \%=(K1/F2N)-1 \qquad \text{(Eqn. 41)}$$

Next, a preliminary R1 value (R1%) is set to be equal to the R1S % value in step 329. Once the R1% value is set, a determination is made in step 330 of whether R1% is greater than RUSE plus 30. If R1% is greater than R1S %. plus 30, then there is no possible combination of R1, R2, N1, and N2 that will satisfy the desired output frequency ($F_O$) for the signal synthesizer 200. Accordingly, the process for configuring the non-presteering circuitry in the frequency synthesizer 101 is done.

If the R1% value is not determined to be greater than R1S % plus 30 in step 330, then the value for R1 is set to be equal to R1% in step 331. After R1 is set, an initial preliminary value for N1 (N1S %) is set in step 332. The N1S % value is calculated according to the following equation:

$$N1S\ \%=R1*(F2N/F_N) \qquad \text{(Eqn. 42)}$$

Once the N1S % value is established, a preliminary value for N1 (N1t) is set to be equal to N1S % in step 333. Once the N1% value is set, a determination is made in step 334 of whether N1% is greater than N1S % plus 10. If N1W is greater than N1S % plus 10, then R1% is incremented in step 335. After R1% is incremented step 330 is repeated. If N1% is not greater than N1S % plus 10, then N1 is set to equal N1% in step 336. After the N1 value is set, a value for F2 is set in step 337. The value for F2 is set according to the following equation:

$$F2=F_N*(N1/R1) \qquad \text{(Eqn. 43)}$$

Once the value for F2 is set, a determination is made in step 338 of whether the POL value is equal to 1. If POL is equal to 1, then the F3 frequency value is set to be equal to the $F_S$ frequency value minus the F2 frequency value in step 339. Otherwise, the F3 frequency value is set in step 340. In step 340, the F3 value is set to be equal to the F2 value minus the $F_S$ value according to the following equation:

$$F3=POL*F_S-POL*F2 \qquad \text{(Eqn. 44)}$$

Once the F3 frequency has been established in either step 340 or step 339, a determination is made in step 341 of whether the F3 frequency is less than or equal to the nominal F3 frequency (F3N) plus 0.5 MHz and greater than or equal to the F3N value minus 0.5 MHz. If the F3 value is less than the F3N value minus 0.5 MHz or greater than the F3N value plus 0.5 MHz, then the preliminary N1 value (N1W) is incremented by 1 in step 343. After the N1% value is incremented, a determination is made in step 334, as described above, of whether the N1% value is greater than the initial preliminary N1 value (N1S %) plus 10.

If the F3 value, in step 341, is less than or equal to the F3N value plus 0.5 MHz and greater than or equal to the F3N value minus 0.5 MHz, then an initial preliminary N2 value (N2S %) is set in step 344. The N2St value is set according to the following equation:

$$N2S\ \%=F2*R2/F3 \qquad \text{(Eqn. 45)}$$

After the N2S % value is set, a preliminary N2 value (N2%) is set to be equal to the N2S % value in step 345. Next, a determination is made in step 346 of whether the N2% value is greater than the N2S % value plus 20. If the N2% value is greater than the N2S % value plus 20, then the preliminary N1 value (N1%) is incremented in step 343. Thereafter, a determination is made in step 334, as described above, of whether the N1% value is greater than the N1S % value plus 10.

If the N2% value, in step 346, is determined to not be greater than the N2S % value plus 20, then N2 is set to be equal to the N2% value in step 347. After N2 value is set, a determination of the frequency error ($F_{SER}$) introduced by the frequency synthesizer 101 is made in step 348. This $F_{SER}$ value can be employed when setting the reference frequency $F_R$, as described above with reference to step 134 in FIG. 4. The frequency error introduced by the frequency synthesizer 101 is calculated according to the following equation:

$$F_{SER}=((F_N*N1/R1)*(1+POL*R2/N2))-F_S \qquad \text{(Eqn. 46)}$$

Once the $F_{SER}$ frequency error is determined, a determination is made in step 349 of whether the frequency error ($F_{SER}$) falls within a predetermined range. In one embodiment of the present invention this range extends from =500 Hz to +500 Hz. If the $F_{SER}$ frequency error does not fall within the predetermined range, then the preliminary N2 value (N2%) is incremented in step 350. Thereafter in step 346, as described above, a determination is made of whether the N2% value is greater than the N2% value plus 20.

If the $F_{SER}$ frequency error is determined to be within the predetermined range in step 349, then the R1, R2, N1, and N2 values are appropriate as presently set and are loaded into the frequency synthesizer 101 in step 352. Once these values are loaded in step 352, the configuration of the non-presteering circuitry in the frequency synthesizer 101 is done.

Figure 17:
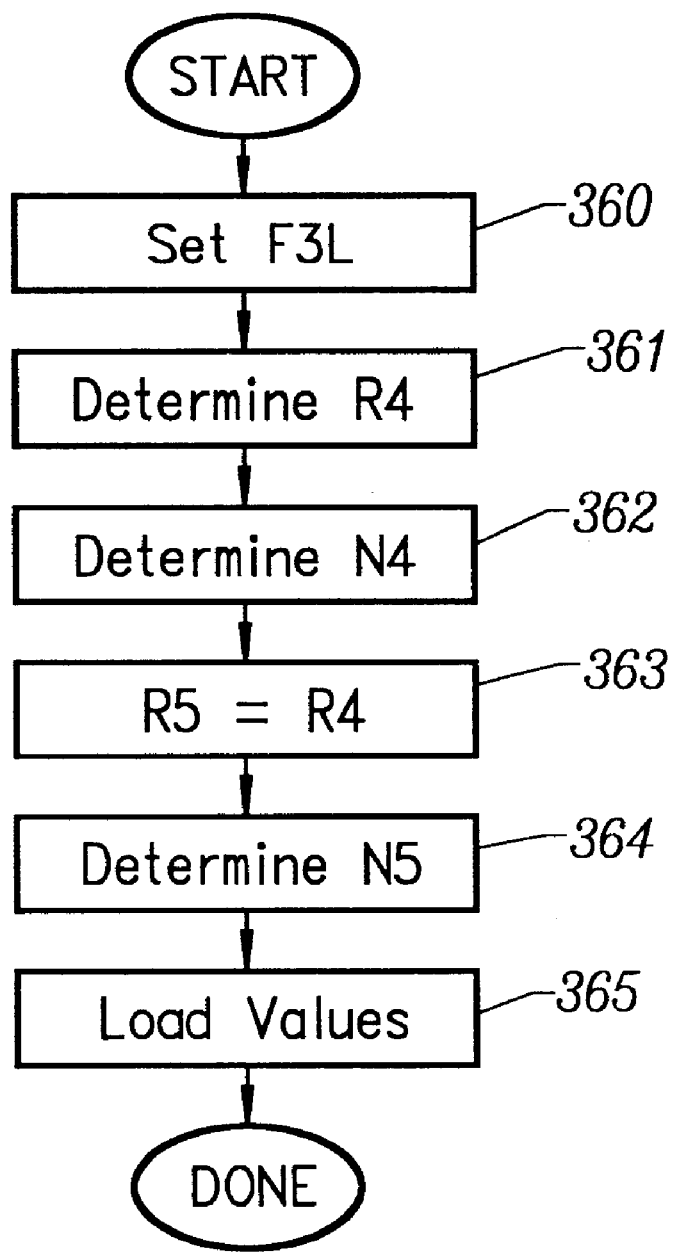
FIG. 17 illustrates a sequence of operations for configuring the presteering circuitry of the frequency synthesizer shown in FIG. 10.

FIG. 17 illustrates a sequence of operations performed in configuring 312 (FIG. 15) the presteering circuitry (FIG. 10) in the frequency synthesizer 101. Initially, a preliminary F3 frequency value (F3L) is set in step 360. The F3L value is calculated according to the following equation:

$$F3L=F_S-F3N/2 \qquad \text{(Eqn. 47)}$$

Once the F3L value is set, a value is determined for R4 in step 361. The value for R4 is calculated according to the following equation:

$$R4 = 1 + \text{INT}(32 \cdot 33 \cdot F_N / F3L) \qquad \text{(Eqn. 48)}$$

Next, a value is determined for N4 in step 362. The N4 value is determined according to the following equation:

$$N4 = \text{INT}(M + F3L \cdot R4 / F_N) \qquad \text{(Eqn. 49)}$$

wherein:

M is a rounding constant. In one embodiment, M is equal to 0.50.

Once the N4 value is determined, the R5 value is set to be equal to the R4 value in step 363. The N5 value is then determined in step 364. The N5 value is calculated according to the following equation:

$$N5 = \text{INT}(M + (F3L + F3N) \cdot R5 / F_N) \qquad \text{(Eqn. 50)}$$

wherein:

M is a rounding constant. In one embodiment, M is equal to 0.50.

Once the N5 value is set, the N4, R4, N5, and R5 values are loaded into the frequency synthesizer 101 in step 365. Once these values are loaded, the configuration of the presteering circuitry (FIG. 10) is done.

C. Hardware For A Signal Synthesizer System

Figure 18:
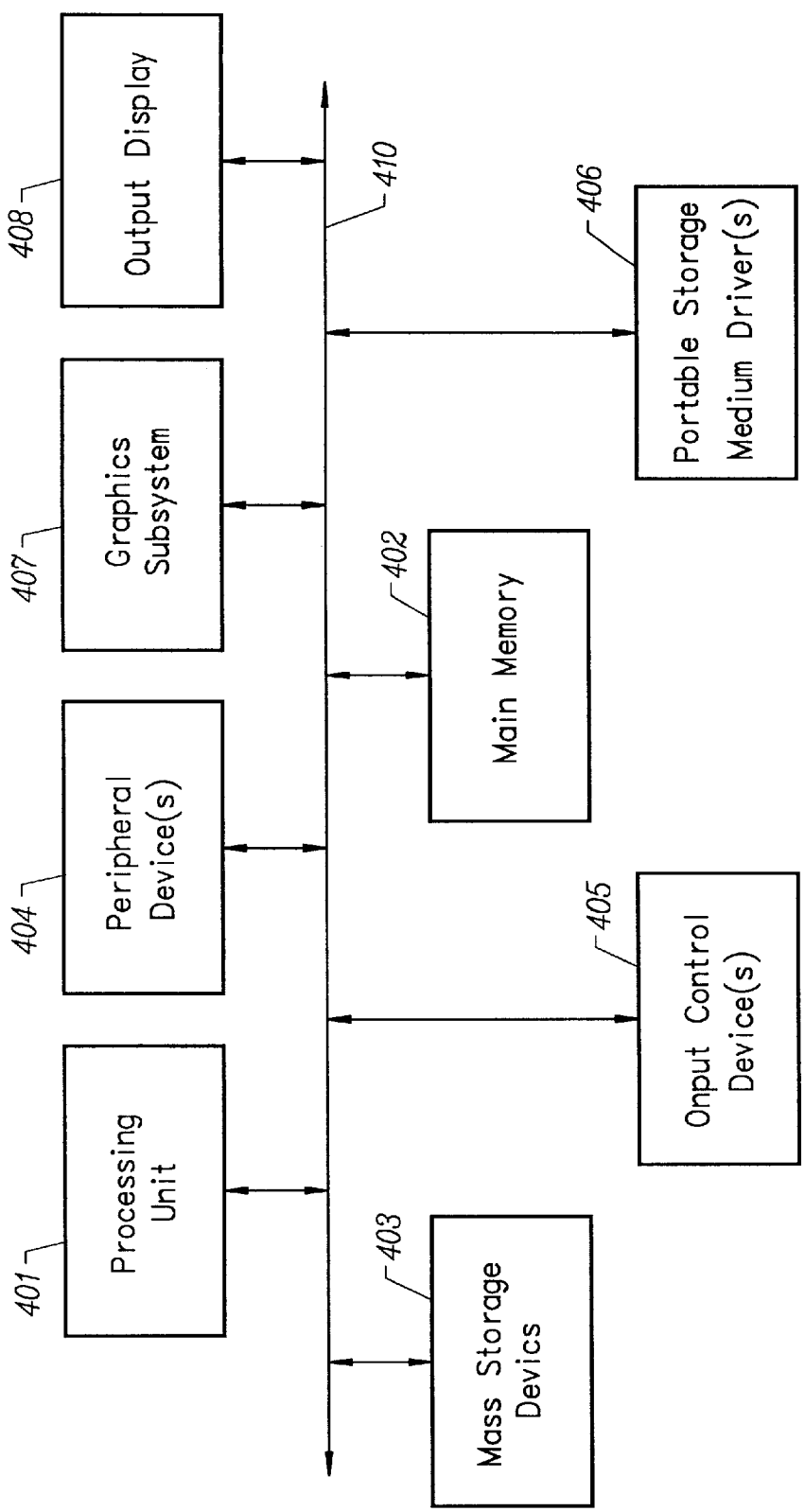
FIG. 18 illustrates hardware employed in one embodiment of the present invention to provide for a signal synthesizer.

FIG. 18 illustrates a high level block diagram of a processing unit based system 400, which is employed in an alternate embodiment of the present invention as a signal synthesizer 100, 200. Accordingly, the processing unit based system 400 is employed for performing a number of processes, including those illustrated in FIGS. 4–8 and 11–17.

The processing unit based system 400 contains a processing unit 401, main memory 402, and an interconnect bus 410. The processing unit 401 can contain a single microprocessor or a plurality of microprocessors for configuring the processing unit based system 400 as a multi-processor system. In an alternate embodiment of the present invention, as described above, the processing unit 401 is a microcontroller.

The processing unit 401 serves as the processing engine for the voltage control engine 105 (FIG. 1). Accordingly, the voltage control engine 105 is implemented using the processing unit 401 in conjunction with a memory or other data storage medium containing corresponding application specific program code instructions for carrying out the process steps described above with reference to FIGS. 4–8 and 11–17.

The main memory 402 stores, in part, instructions and data for retrieval and execution by the processing unit 401. If a process, such as one of the processes illustrated in FIGS. 4–8 and 11–17 is wholly or partially implemented in software, then the main memory 402, in one embodiment of the present invention, stores the executable instructions for implementing the process when the signal synthesizer system 400 is in operation. For example, the main memory 402 will store program code instructions to be employed by the voltage control engine 105. The data shown above in Table A can also be maintained in the main memory 402. The main memory, in one embodiment of the present invention, includes banks of dynamic random access memory (DRAM) as well as high speed cache memory. In an alternate embodiment of the present, invention the main memory 402 also includes read only memory (ROM).

The processing unit based system 400 further includes a mass storage device 403, peripheral device(s) 404, portable storage medium drive(s) 406, input control device(s) 405, a graphics subsystem 407, and an output display 408. For purposes of simplicity, all components in the system 400 are shown in FIG. 18 as being connected via the bus 410. However, the system 400 components may be connected through one or more data transport means. For example, in one embodiment of the present invention, the processing unit 401 and the main memory 402 are connected via a local microprocessor bus, and the mass storage device 403, peripheral device(s) 404, portable storage medium drive(s) 406, and graphics subsystem 407 are connected via one or more input/output (I/O) busses.

The mass storage device 403, which can be implemented with a magnetic disk drive or an optical disk drive, is a non-volatile storage device for storing data and instructions for use by the processing unit 401. In software embodiments of the present invention, the mass storage device 403 stores the instructions executed by the processing unit 401 to perform processes for the voltage control engine 105, such as those illustrate in FIGS. 4–8 and 11–17. The mass storage device 403 also acts as a storage medium for data that is employed by the signal synthesizer, such as the data in Table A.

The portable storage medium drive 406 operates in conjunction with a portable non-volatile storage medium, such as a floppy disk, a compact disc read only memory (CD-ROM), or an integrated circuit non-volatile memory adapter (i.e. PC-MCIA adapter) to input and output data and code to and from the system 400. In one embodiment of the present invention, the instructions for enabling the system 400 to execute processes, such as those illustrated in FIGS. 4–8 and 11–17, are stored on such a portable medium, and are input to the system 400 via the portable storage medium drive 406. The processing unit 401 is then able to retrieve and execute the instructions.

The peripheral device(s) 404 includes devices within the signal synthesizer, such as a device including the frequency synthesizer 101, frequency divider 102, and frequency reference 106 components other than the voltage control engine 105. In embodiments of the present invention, the peripheral device(s) 406 include a communications controller, such as a network interface card or integrated circuit, for interfacing the system 400 to a communications network. Instructions for enabling the system 400 to perform processes, such as those illustrated in FIGS. 4–8 and 11–17, can then be downloaded into the main memory 402 over a communications network.

The input control device(s) 405 provide a portion of the user interface for a user of the signal synthesizer system 400. In embodiments of the present invention, the input control device(s) 405 include an alphanumeric keypad for inputting alphanumeric and other key information, a cursor control device, such as a mouse, a trackball, stylus, or cursor direction keys. The input control device(s) 405 serve as the means by which a signal synthesizer user enters the desired output frequency ($F_O$) for the signal synthesizer 100.

In order to display textual and graphical information, the system 400 contains the graphics subsystem 407 and the output display 408. In embodiments of the present invention, the output display 408 includes a cathode ray tube (CRT) display, liquid crystal display (LCW or other display means. The graphics subsystem 407 receives textual and graphical information, and processes the information for output to the output display 408.

The process steps and other functions described above with respect to embodiments of the present invention are implemented as software instructions in one embodiment of the present invention. More particularly, the process steps illustrated in FIGS. 4–8 and 11–17 as well as other operations performed by the voltage control engine 105 are implemented as software instructions in such an embodiment. For the preferred software implementation, the software includes a plurality of computer executable instructions for implementation on a processing unit based system 400. Prior to loading into such a system, the software instructions reside as encoded information on a computer readable medium, such as a magnetic floppy disk, magnetic tape, hard disk, PC-MCIA card, and compact disc read only memory (CD-ROM).

In an alternate embodiment of the present invention, circuitry is implemented to perform the process steps and other functions described herein.

Although the invention has been described above with particularity, this was merely to teach one of ordinary skill in the art how to make and use the invention. Many modifications will fall within the scope of the invention, as that scope is defined by the following claims.

What is claimed is:

1. A frequency reference comprising:
a voltage controlled oscillator for providing a signal having a reference frequency, wherein said voltage controlled oscillator has a nominal frequency and an input for receiving a frequency setting voltage, wherein the reference frequency is set in response to the frequency setting voltage;
a programmable voltage generator having an output coupled to the input of said voltage controlled oscillator for providing the frequency setting voltage and an input for receiving a voltage setting value, wherein the frequency setting voltage is provided in response to the voltage setting value; and
a voltage control engine for setting the voltage setting value, said voltage control engine being coupled to the input of said programmable voltage generator for providing the voltage setting value.

2. The frequency reference of claim 1, wherein said programmable voltage generator includes:
a control voltage divider for processing a source voltage in response to a control value to produce a control voltage, wherein the control voltage divider has a voltage input for receiving the source voltage, a control input for receiving the control value, and an output for providing the control voltage.

3. The frequency reference of claim 2, wherein the programmable voltage generator includes:
a voltage adder for summing voltages that are provided to said voltage adder to obtain the frequency setting voltage, said voltage adder having an output for providing the frequency setting voltage and forming the output of said programmable voltage generator, said voltage adder being coupled to the output of the control voltage divider.

4. The frequency reference of claim 3, wherein the programmable voltage generator further includes:
a control scaling voltage divider coupling the output of said control voltage divider to said voltage adder, said control scaling voltage divider having an input coupled to the output of said control voltage divider to receive the control voltage and an output coupled to the voltage adder for providing a scaled control voltage, wherein the scaled control voltage is equal to the control voltage divided by a control scaling divisor.

5. The frequency reference of claim 4, wherein the control input of said control voltage divider forms the input of said programmable voltage generator, wherein said voltage control engine includes a processing unit coupled to a processing unit readable medium, wherein said processing unit readable medium has a set of instructions stored therein for enabling said voltage control engine to configure said frequency reference, said set of instructions including:
a first set of instructions, which when executed by the processing unit causes said voltage control engine to determine an ideal frequency setting voltage, wherein the ideal frequency setting voltage is a voltage for causing the reference frequency to have a predetermined deviation from the nominal frequency of said voltage controlled oscillator; and
a second set of instructions, which when executed by the processing unit causes said voltage control engine to set the voltage setting value.

6. The frequency reference of claim 5, wherein the first set of instructions includes:
a third set of instructions, which when executed by the processing unit cause said voltage control engine to calculate the ideal frequency setting voltage in accordance with the following equation:

$$V_{FS}=A+B*(PPM_{FR})+C*(PPM_{FR})^2$$

wherein:
$IV_{FS}$ is the ideal frequency setting voltage,
A is a constant,
B is a first order coefficient,
C is a second order coefficient, and
$PPM_{FR}$ is the predetermined deviation from the nominal frequency.

7. The frequency reference of claim 6, wherein the second set of instructions includes:
a fourth set of instructions, which when executed by the processing unit cause said voltage control engine to determine an ideal control voltage; and
a fifth set of instructions, which when executed by the processing unit cause said voltage control engine to set the control value in response to the ideal control voltage.

8. The frequency reference of claim 7, wherein said fourth set of instructions includes:
a sixth set of instructions, which when executed by the processing unit cause said voltage control engine to calculate the ideal control voltage according to the following equation:

$$IV_C=Y*(IV_{FS}-V_{AV})$$

wherein:
$IV_C$ is the ideal control voltage,
Y is the control scaling divisor, and
$V_{AV}$ is a sum of all voltages being provided to the voltage adder, except the scaled control voltage.

9. The frequency reference of claim 8, wherein Y is equal to 1.

10. The frequency reference of claim 8, wherein said fifth set of instructions includes:
a seventh set of instructions, which when executed by the processing unit cause said voltage control engine to calculate the control value according to the following equation:

$$CV=INT\ (M+IV_C*(CVM/V_S)$$

wherein:

CV is the control value,

M is a rounding constant, $V_S$ is the source voltage, and

CVM is a maximum possible value for the control value.

11. The frequency reference of claim 4, wherein the programmable voltage reference further includes:

a source voltage divider having a voltage input for receiving a source reference voltage, a control input for receiving a source control value, and an output coupled to the voltage input of the control voltage divider for providing the source voltage, wherein the source voltage is provided in response to the source reference voltage and the source control value.

12. The frequency reference of claim 11, wherein said voltage control engine is coupled to provide the source control value to the control input of said source voltage divider, wherein said voltage control engine includes a processing unit coupled to a processing unit readable medium, wherein said processing unit readable medium has a set of instructions stored therein for enabling said voltage control engine to configure the frequency reference, said set of instructions including:

an eighth set of instructions, which when executed by the processing unit cause said voltage control engine to set the source control value.

13. The frequency reference of claim 12, wherein said eighth set of instructions includes:

a ninth set of instructions, which when executed by the processing unit cause said voltage control engine to calculate an ideal source voltage according to the following equation:

$$IV_S = Y^*(VSPN)$$

wherein:

$IV_S$ is the ideal source voltage,

Y is the control scaling divisor, and

VSPN is a voltage span value defining a magnitude of a voltage range for the scaled control voltage.

14. The frequency reference of claim 13, wherein said eighth set of instructions further includes:

a tenth set of instructions, which when executed by the processing unit cause said voltage control engine to calculate the source control value according to the following equation:

$$SCV = INT(M + IV_S * SCVM/V_{SR})$$

wherein:

SCV is the source control value,

M is a rounding constant, $V_{SR}$ is the source reference voltage, and

SCVM is a maximum possible value for the source control value.

15. The frequency reference of claim 4, wherein the programmable voltage reference further includes:

an offset voltage divider for processing an offset reference voltage in response to an offset control value to provide an offset voltage, wherein said offset voltage divider has a voltage input for receiving the offset reference voltage, a control input for receiving the offset control value, and an output for providing the offset voltage, said output of said offset voltage divider being coupled to said voltage adder.

16. The frequency reference of claim 15, wherein said programmable voltage generator further includes:

an offset scaling voltage divider coupling the output of said offset voltage divider to said voltage adder, said offset scaling voltage divider having an input coupled to the output of said offset voltage divider to receive the offset voltage and an output coupled to the voltage adder for providing a scaled offset voltage, wherein the scaled offset voltage is equal to the offset voltage divided by an offset scaling divisor.

17. The frequency reference of claim 16, wherein said voltage control engine is coupled to provide the offset control value to the control input of said offset voltage divider, wherein said voltage control engine includes a processing unit coupled to a processing unit readable medium, wherein said processing unit readable medium has a set of instructions stored therein for enabling said voltage control engine to configure the frequency reference, said set of instructions including:

an eleventh set of instructions, which when execute by the processing unit cause said voltage control engine to set the offset control value.

18. The frequency reference of claim 17, wherein said eleventh set of instructions includes:

a twelfth set of instructions, which when executed by the processing unit cause the voltage control engine to calculate an ideal offset voltage according to the following equation:

$$IV_O = X^*(A - V_{AD} - (VSPN*B/2))$$

wherein:

$IV_O$ is the ideal offset voltage,

X is the offset scaling divisor, $V_{AD}$ is a sum of all voltages provided to the voltage adder, except the scaled control voltage and the scaled offset voltage, and VSPN is a voltage span value defining a magnitude of a voltage range for the scaled control voltage.

19. The frequency reference of claim 18, wherein X is equal to 1.

20. The frequency reference of claim 18, wherein said eleventh set of instructions includes:

a thirteenth set of instructions, which when executed by the processing unit causes said voltage control engine to calculate the offset control value according to the following equation:

$$OCV = INT(M + IV_O * (OCVM/V_{OR}))$$

wherein:

OCV is the offset control value,

M is a rounding constant, $V_{OR}$ is the offset reference voltage, and

OCVM is a maximum possible value for the offset control value.

21. The frequency reference of claim 1, wherein the voltage setting value causes the frequency setting voltage to cause the reference frequency provided by the voltage controlled oscillator to have a predetermined deviation from the nominal frequency.

22. A method for setting a frequency setting voltage for a frequency reference, wherein the frequency reference has a nominal frequency and provides a signal having a reference frequency, wherein the reference frequency is established in response to the frequency setting voltage and the frequency setting voltage is established in response to a control value, wherein said method comprises the steps of:

(a) calculating an ideal frequency setting voltage, wherein the ideal frequency setting voltage is a voltage for causing the reference frequency to have a predetermined deviation from the nominal frequency; and (b) setting the control value in response to the ideal frequency setting voltage.

23. The method of claim 22, wherein said step (a) includes the step of:

calculating the ideal frequency setting voltage in accordance with the following equation:

$$VFS = A + B*(PPM_{FR}) + C*(PPM_{FR})^2$$

wherein:

$IV_{FS}$ is the ideal frequency setting voltage,

A is a constant,

B is a first order coefficient,

C is a second order coefficient, and $PPM_{FR}$ is the predetermined deviation from the nominal frequency.

24. The method of claim 23, wherein the frequency setting voltage is a sum of a set of voltages including at least a voltage derived from a control voltage, wherein said step (b) includes the steps of:

determining an ideal control voltage in response to the frequency setting voltage; and determining the control value in response to the ideal control voltage.

25. The method of claim 24, wherein said step of determining the ideal control voltage includes the step of:

calculating the ideal control voltage according to the following equation:

$$IV_C = Y*(IV_{FS} - V_{AV})$$

wherein:

$IV_C$ is the ideal control voltage,

Y is a control scaling divisor, and $V_{AV}$ is a sum of all voltages in the set of voltages, except the voltage derived from the control voltage.

26. The method of claim 25, wherein the voltage derived from the control voltage is equal to the control scaling divisor multiplied by the control voltage.

27. The method of claim 26, wherein the control scaling divisor is equal to 1.

28. The method of claim 26, wherein the set of voltages consists of only the voltage derived from the control voltage.

29. The method of claim 26, wherein the control voltage is a result of multiplying a source voltage by the control value divided by a maximum possible value for the control value, wherein the step of determining the control value in response to the ideal control voltage includes the step of:

calculating the control value according to the following equation:

$$CV = INT(M + IV_C*(CVM/V_S))$$

wherein:

CV is the control value,

M is a rounding constant, $V_S$ is the source voltage, and

CVM is the maximum possible value for the control value.

30. A method for configuring a frequency reference, wherein the frequency reference has a nominal frequency and provides a signal having a reference frequency, wherein the reference frequency is established in response to a frequency setting voltage, wherein the frequency setting voltage is equal to a summation of voltages in a set of voltages, wherein the set of voltages includes a scaled offset voltage and a scaled control voltage, wherein the scaled offset voltage is derived in response to an offset reference voltage and an offset control value and the scaled control voltage is derived in response to a source voltage and a control value, wherein the source voltage is derived in response to a source reference voltage and a source control value, said method comprising the steps of:

(a) determining a characteristic equation for the frequency setting voltage as a function of a deviation of the reference frequency from the nominal frequency;

(b) setting the offset control value; and (c) setting the source control value.

31. The method of claim 30, wherein the characteristic equation is a second order equation expressed as follows:

$$V_{FS} = A + B*(PPM_{FR}) + C*(PPM_{FR})^2$$

wherein:

$V_{FS}$ is the frequency setting voltage,

A is a constant,

B is a first order coefficient,

C is a second order coefficient, and $PPM_{FR}$ is the deviation of the reference frequency from the nominal frequency.

32. The method of claim 30, wherein said step (b) includes the step of:

calculating an ideal offset voltage according to the following equation:

$$IV_O = X*(A - VAD - (VSPN*B/2))$$

wherein:

$IV_O$ is the ideal offset voltage,

X is an offset scaling divisor, $V_{AD}$ is a sum of all voltages in the set of voltages, except the scaled control voltage and the scaled offset voltage, VSPN is a voltage span value defining a magnitude of a voltage range for the scaled control voltage.

33. The method of claim 32, wherein said step (b) further includes the step of:

calculating the offset control value according to the following equation:

$$OCV = INT(M + IV_O*(OCVM/V_{OR}))$$

wherein:

OCV is the offset control value,

M is a rounding constant, $V_{OR}$ is the offset reference voltage, and

OCVM is a maximum possible value for the offset control value.

34. The method of claim 30, wherein said step (c) includes the step of:

determining an ideal source voltage according to the following equation:

$$IV_S = Y*(VSPN)$$

wherein:

$IV_S$ is the ideal source voltage,

Y is a control scaling divisor, and

VSPN is a voltage span value defining a magnitude of a voltage range for the scaled control voltage.

35. The method of claim 34, wherein said step (c) further includes the step of:

calculating the source control value according to the following equation:

$$SCV = INT(M + IV_S * SCVM / V_{SR})$$

wherein:

SCV is the source control value,

M is a rounding constant, $V_{SR}$ is the source reference voltage, and

SCVM is a maximum possible value for the source control value.

36. An apparatus for setting a frequency setting voltage for a frequency reference, wherein the frequency reference has a nominal frequency and provides a signal having a reference frequency, wherein the reference frequency is established in response to the frequency setting voltage and the frequency setting voltage is established in response to a control value, wherein said apparatus comprises:

a means for calculating an ideal frequency setting voltage, wherein the ideal frequency setting voltage is a voltage for causing the reference frequency to have a predetermined deviation from the nominal frequency; and a means for setting the control value in response to the ideal frequency setting voltage.

37. The apparatus of claim 36, wherein said means for calculating includes:

a means for calculating the ideal frequency setting voltage in accordance with the following equation:

$$IV_{FS} = A + B*(PPM_{FR}) + C*(PPM_{FR})^2$$

wherein:

$IV_{FS}$ is the ideal frequency setting voltage,

A is a constant,

B is a first order coefficient,

C is a second order coefficient, and $PPM_{FR}$ is the predetermined deviation from the nominal frequency.

38. The apparatus of claim 37, wherein the frequency setting voltage is a sum of a set of voltages including at least a voltage derived from a control voltage, wherein said means for setting the control value include:

a means for determining an ideal control voltage in response to the ideal frequency setting voltage; and a means for determining the control value in response to the ideal control voltage.

39. The apparatus of claim 38, wherein said means for determining the ideal control voltage include:

a means for calculating the ideal control voltage according to the following equation:

$$IV_C = Y*(IV_{FS} - V_{AV})$$

wherein:

IVC is the ideal control voltage,

Y is a control scaling divisor, and $V_{AV}$ is a sum of all voltages in the set of voltages, except the voltage derived from the control voltage.

40. The apparatus of claim 39, wherein the control voltage is equal to a source voltage multiplied by the control value divided by a maximum possible value for the control value, wherein said means for determining the control value in response to the ideal control voltage include:

a means for calculating the control value according to the following equation:

$$CV = INT(M + IV_C*(CVM / V_S))$$

wherein:

CV is the control value;

M is a rounding constant;

$V_S$ is the source voltage; and

CVM is the maximum possible value for the control value.

* * * * *